(12) United States Patent
Endo et al.

(10) Patent No.: US 10,299,411 B2
(45) Date of Patent: May 21, 2019

(54) DATA CENTER

(71) Applicant: FUJITSU LIMITED, Kawasaki-shi, Kanagawa (JP)

(72) Inventors: Hiroshi Endo, Isehara (JP); Hiroyuki Fukuda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 70 days.

(21) Appl. No.: 15/297,284

(22) Filed: Oct. 19, 2016

(65) Prior Publication Data
US 2017/0164523 A1    Jun. 8, 2017

(30) Foreign Application Priority Data

Dec. 3, 2015 (JP) .................................. 2015-236853

(51) Int. Cl.
*H05K 7/20* (2006.01)

(52) U.S. Cl.
CPC ..... *H05K 7/20745* (2013.01); *H05K 7/20145* (2013.01); *H05K 7/20172* (2013.01); *H05K 7/20836* (2013.01)

(58) Field of Classification Search
CPC .................................................. H05K 7/20745
See application file for complete search history.

(56) References Cited

U.S. PATENT DOCUMENTS

| | | | |
|---|---|---|---|
| 9,935,524 B2 * | 4/2018 | Schmitt | H02K 7/18 |
| 2010/0263825 A1 | 10/2010 | Noteboom et al. | |
| 2010/0304657 A1 * | 12/2010 | Gallmann | G06F 1/20 454/184 |
| 2012/0012278 A1 | 1/2012 | Noteboom et al. | |
| 2013/0048266 A1 * | 2/2013 | Bauchot | H05K 7/20836 165/299 |
| 2014/0233173 A1 * | 8/2014 | Matsushita | H05K 7/20745 361/679.46 |
| 2014/0301027 A1 | 10/2014 | Noteboom et al. | |

(Continued)

FOREIGN PATENT DOCUMENTS

JP    2002-267244    9/2002
JP    2009-275994    11/2009

(Continued)

OTHER PUBLICATIONS

Japanese Office Action dated Feb. 12, 2019 for corresponding Japanese Patent Application No. 2015-236853, with Partial English Translation, 6 pages.

*Primary Examiner* — Gregory L Huson
*Assistant Examiner* — Elizabeth M. May
(74) *Attorney, Agent, or Firm* — Fujitsu Patent Center

(57) ABSTRACT

A data center includes a first rack, a second rack, a supply duct provided over a first space between the first and second rack, a first circulation duct including a first suction port disposed at an end side of the first rack and a first exhaust port disposed at the first space side and provided between an upper portion of the first rack and the supply duct so as to close up the first space, a second circulation duct including a second suction port disposed at an end side of the second rack and a second exhaust port disposed at the first space side and provided between an upper portion of the second rack and the supply duct so as to close up the first space, a first and second barrier that closes up the first space at one and the other end of the first and second rack, respectively.

11 Claims, 18 Drawing Sheets

(56) References Cited

U.S. PATENT DOCUMENTS

| | | | | |
|---|---|---|---|---|
| 2015/0208553 | A1* | 7/2015 | Bauchot | H05K 7/20745 |
| | | | | 361/679.47 |
| 2016/0081230 | A1 | 3/2016 | Noteboom et al. | |
| 2017/0127574 | A1* | 5/2017 | Heim | H05K 7/20145 |

FOREIGN PATENT DOCUMENTS

| | | |
|---|---|---|
| JP | 2012-199300 | 10/2012 |
| JP | 2012-524940 A | 10/2012 |

* cited by examiner

FIG. 12

| OUTSIDE AIR TEMPERATURE [°C] | CIRCULATION RATE [%] |
|---|---|
| 10 | 50 |
| 12 | 44 |
| 14 | 38 |
| 16 | 29 |
| 18 | 17 |
| 20 | 0 |
| 22 | 0 |
| 24 | 0 |
| 26 | 0 |

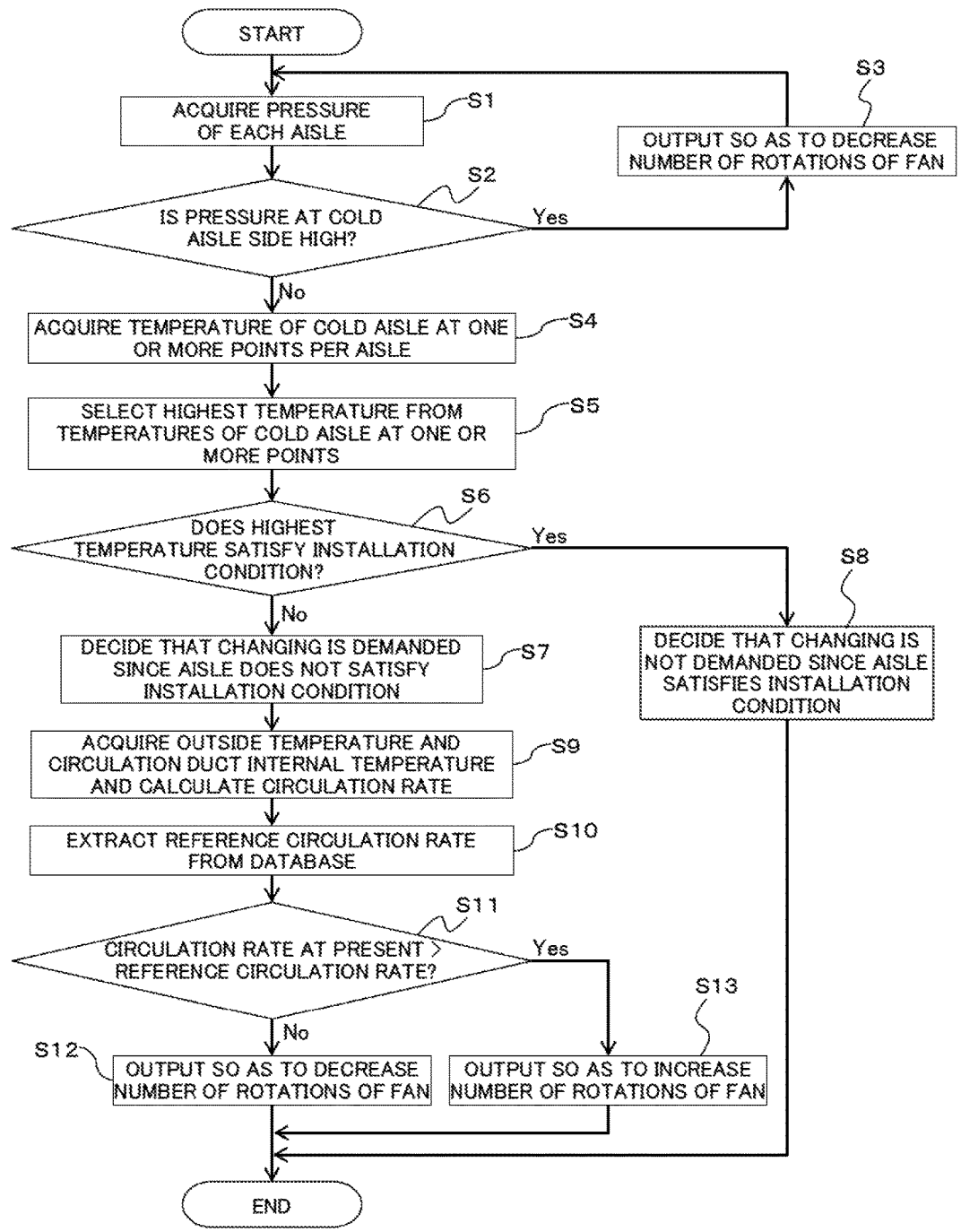

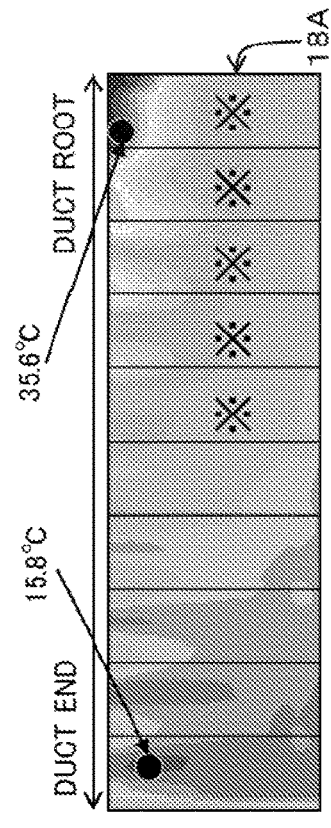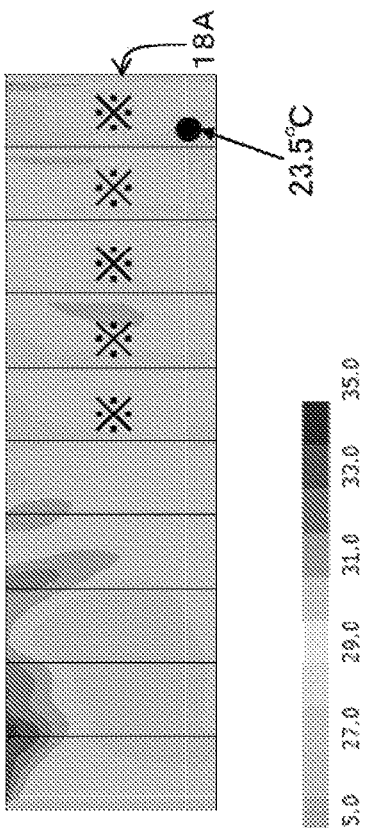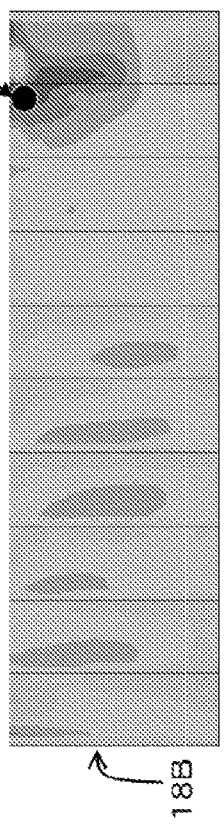
FIG. 15A
FIG. 15B
FIG. 15C
FIG. 15D

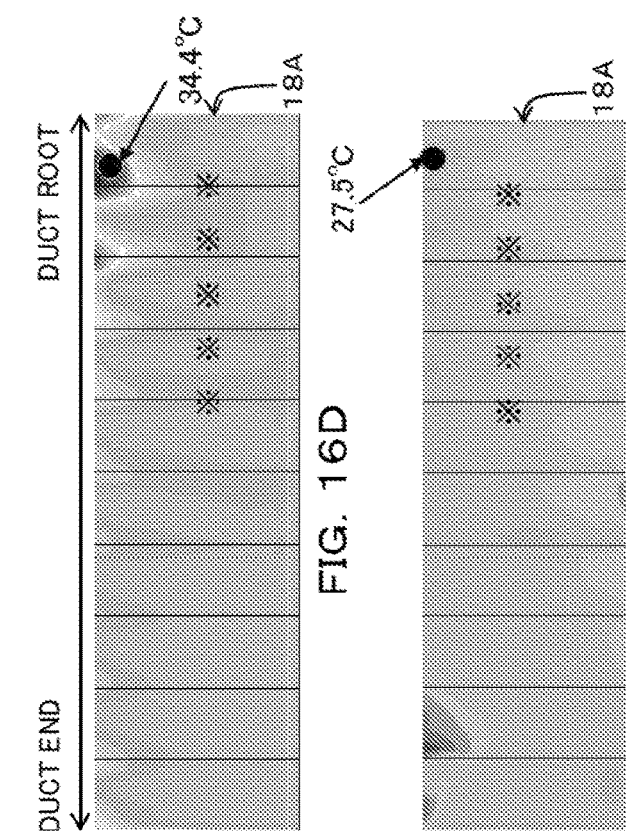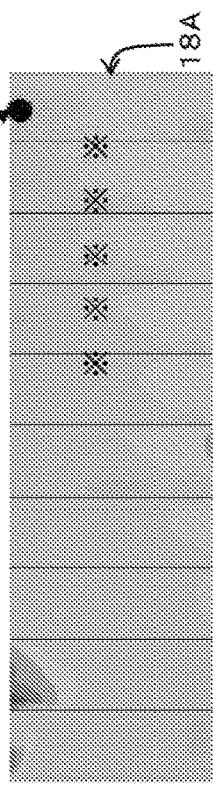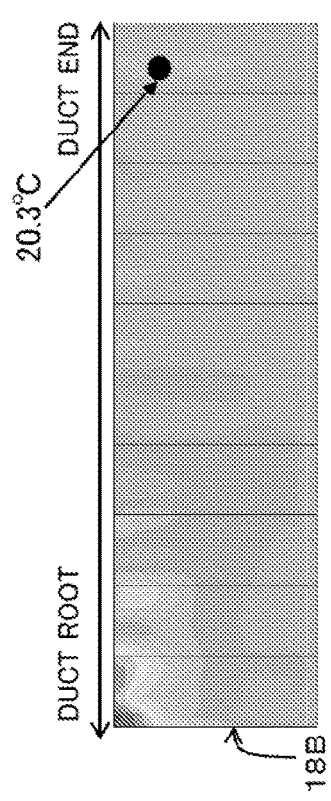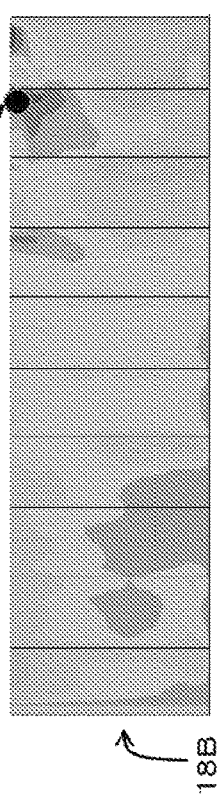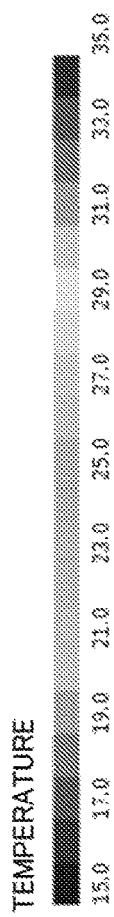

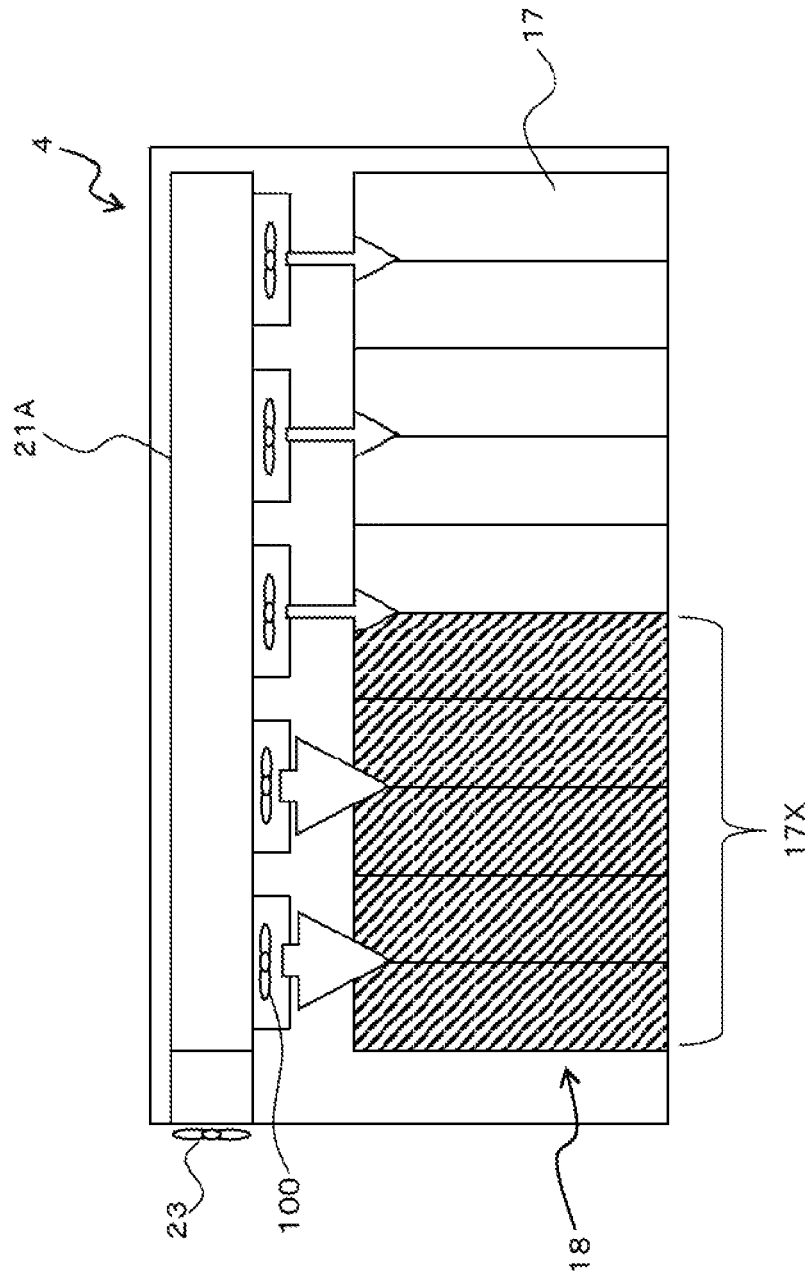

DATA CENTER

CROSS-REFERENCE TO RELATED APPLICATION

This application is based upon and claims the benefit of priority of the prior Japanese Patent Application No. 2015-236853, filed on Dec. 3, 2015, the entire contents of which are incorporated herein by reference.

FIELD

The embodiments discussed herein are related to a data center.

BACKGROUND

In recent years, as an air conditioning system for a data center, attention is paid to an outside air cooling system utilizing outside air.

For example, an outside air cooling system is available wherein the temperature of outside air taken in is adjusted by a temperature adjustment apparatus to generate cold air and the generated cold air blows out from the floor side into a space at one side of a rack row while warm air exhausted into a space at the other side of the rack row is exhausted to the outside from the ceiling side. Then, the warm air is circulated to the temperature adjustment apparatus, or an air conditioner is provided over the space at the one side of the rack row toward which cold air is blown up such that the temperature of the warm air is adjusted to generate cold air and the generated cold air is supplied into the space at the one side of the rack row.

Further, for example, also an outside air cooling system is available wherein an air conditioning room and a server room are provided in a data center, and, when the temperature of outside air is high, outside air taken in is cooled by the air conditioning room and supplied into the server room, but when the temperature of outside air is low, outside air taken in is supplied as it is into the server room. Further, when the temperature of outside air is excessively low, part of warm air to be exhausted to the outside is sometimes returned to the air conditioning room such that it is mixed with outside air and supplied into the server room.

SUMMARY

According to an aspect of the embodiment, a data center includes a first rack including a first electronic apparatus and further including a first air intake face that inhales air to be supplied to the first electronic apparatus and a first air exhaust face that exhausts air exhausted from the first electronic apparatus as first exhaust air, a second rack including a second electronic apparatus and further including a second air intake face that inhales air to be supplied to the second electronic apparatus and a second air exhaust face that exhausts air exhausted from the second electronic apparatus as second exhaust air, the second air intake face being disposed in an opposing relationship to the first air intake face, a supply duct provided over a first space between the first air intake face and the second air intake face, including an air intake fan and that supplies air inhaled by the air intake fan to the first space, a first circulation duct including a first suction port that is disposed at an end portion side of the first rack and that sucks the first exhaust air and a first exhaust port that is disposed at the first space side and that exhausts the first exhaust air, the first circulation duct being provided between an upper portion of the first rack and the supply duct so as to close up the first space and that circulates the first exhaust air to the first space, a second circulation duct including a second suction port that is disposed at an end portion side of the second rack and that sucks the second exhaust air and a second exhaust port that is disposed at the first space side and that exhausts the second exhaust air, the second circulation duct being provided between an upper portion of the second rack and the supply duct so as to close up the first space and that circulates the second exhaust air to the first space, a first barrier that closes up the first space at one end portion of the first rack and the second rack, and a second barrier that closes up the first space at the other end portion at the opposite side to the one end portion of the first rack and the second rack.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIGS. 9A and 9B are schematic views illustrating a configuration of the circulation duct provided in the data center according to the present embodiment, wherein FIG. 9A is a side elevational view and FIG. 9B is a bottom plan view;

FIG. 12 is a view depicting a correspondence table of circulation rates stored in a database provided in the data center according to the present embodiment;

FIG. 13 is a flow chart illustrating control in the data center according to the present embodiment;

FIGS. 14A and 14B are views illustrating a model of a thermal fluid analysis for verifying a reduction effect of an intake air temperature distribution in the data center according to the present embodiment, wherein FIG. 14A depicts a model of a comparative example and FIG. 14B depicts a model of the present embodiment;

FIGS. 15A to 15D are views depicting results of a thermal fluid analysis based on a first condition for verifying a reduction effect of the intake air temperature distribution in the data center according to the present embodiment, wherein FIGS. 15A and 15B depict results of the analysis of the model of the comparative example and FIGS. 15C and 15D depict results of the analysis of the model of the present embodiment;

FIGS. 16A to 16D are views depicting results of a thermal fluid analysis based on a second condition for verifying a reduction effect of the intake air temperature distribution in the data center according to the present embodiment, wherein FIGS. 16A and 16B depict results of the analysis of the model of the comparative example and FIGS. 16C and 16D depict results of the analysis of the model of the present embodiment;

FIG. 18 is a schematic side elevational view illustrating the subject in the conventional data center.

DESCRIPTION OF EMBODIMENTS

Figure 1:
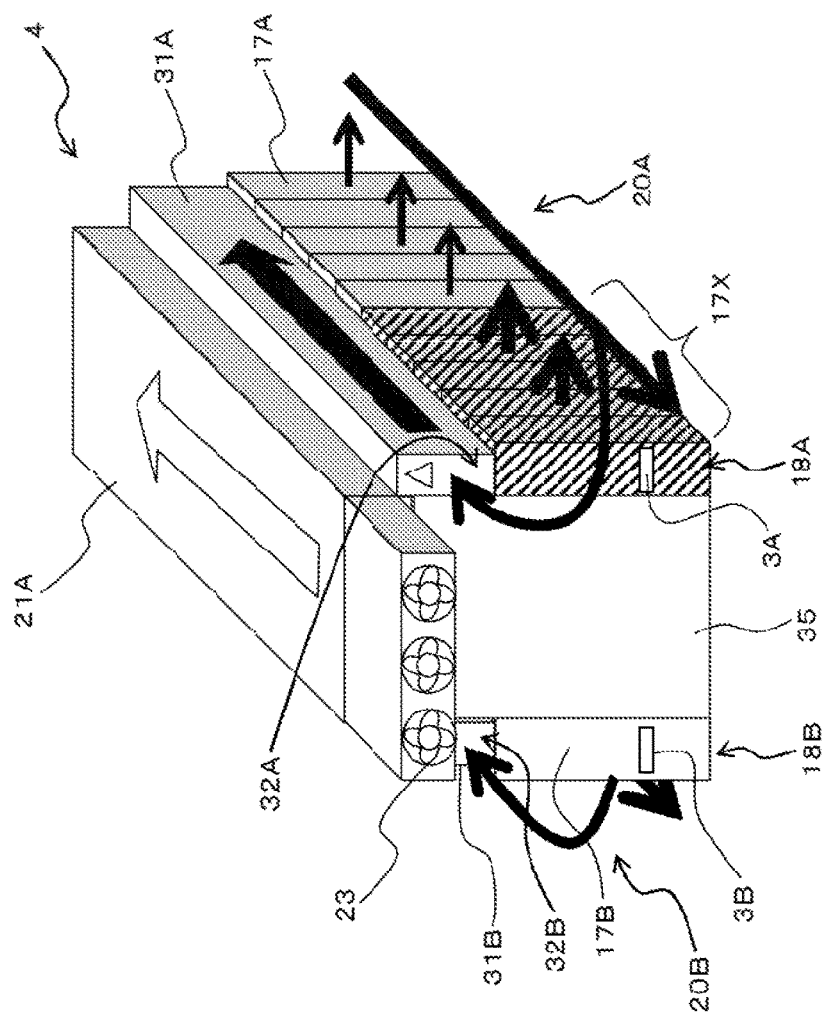
FIG. 1 is a schematic perspective view illustrating a data center according to an embodiment.

Incidentally, in the floor blowing system described above in which cold air blows out from the floor side toward a space at one side of a rack row and warm air exhausted to a space at the other side of the rack row is exhausted from the ceiling side, warm air passes over the rack row and is circulated from the space at the other side of the rack row to the space at the one side, and the cooling efficiency drops.

Further, where the space at the one side of the rack row and the space at the other side are partitioned by a hanging wall or the like and an air conditioner is provided over the space at the one side of the rack row, power for operating the air conditioner is demanded. Therefore, the measures are not preferable when it is intended to implement reduction of the power.

Further, where warm air is returned to the air conditioning room and is mixed with outside air, warm air is circulated to the air conditioning room and the air conditioner is utilized usually. Therefore, since power for operating the air conditioner and a fan is demanded, the measures are not preferable when it is tried to implement reduction of the power.

Therefore, it seems recommendable to adopt the ceiling blowing system in which cold air is blown out from the ceiling side into the space at the one side of the rack row and exhaust warm air exhausted into the space at the other side of the rack row from the ceiling side such that the warm air passes over the rack row and is partly circulated from the space at the other side of the rack row to the space at the one side so as to be mixed with cold air thereby to adjust the temperature (intake air temperature) of air to be supplied to an electronic apparatus.

However, the temperature of exhaust air (warm air) exhausted from the racks configuring the rack row differs depending upon a mounted situation or an operating situation of the electronic apparatus in the racks configuring the rack row. Therefore, also the temperature of the circulated warm air differs, and a temperature distribution is generated in the air to be supplied to the electronic apparatus mounted in the racks.

If a temperature distribution is generated in the air to be supplied to the electronic apparatus mounted in the racks as described above, then this makes effective cooling difficult and makes it difficult to implement power saving.

Therefore, it is desirable to implement a data center in which the cooling efficiency is improved while power saving is implemented.

In the following, a data center according to the present embodiment is described with reference to FIGS. 1 to 18.

The data center of the present embodiment is applied to an outside air introduction type data center in which, in order to suppress power consumption, outside air (cold air) is introduced to cool electronic apparatus such as, for example, servers, and particularly to a direct outside air introduction type data center into the inside of which outside air is taken directly. It is to be noted that such electronic apparatus are hereinafter referred to sometimes as electron equipment or ICT (Information and Communication Technology) equipment.

Figure 5:
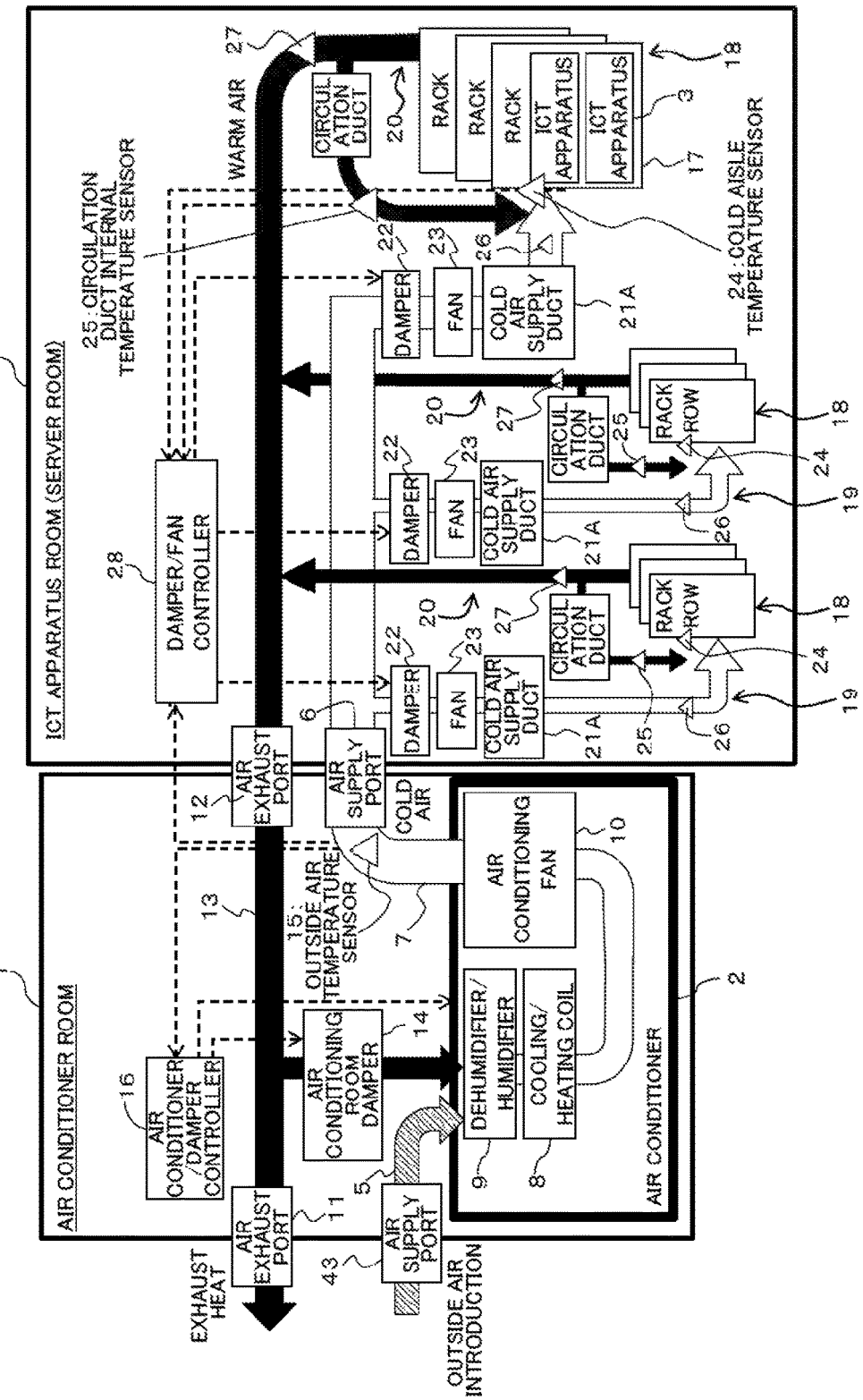
FIG. 5 is a block diagram illustrating the data center according to the present embodiment.
Figure 6:
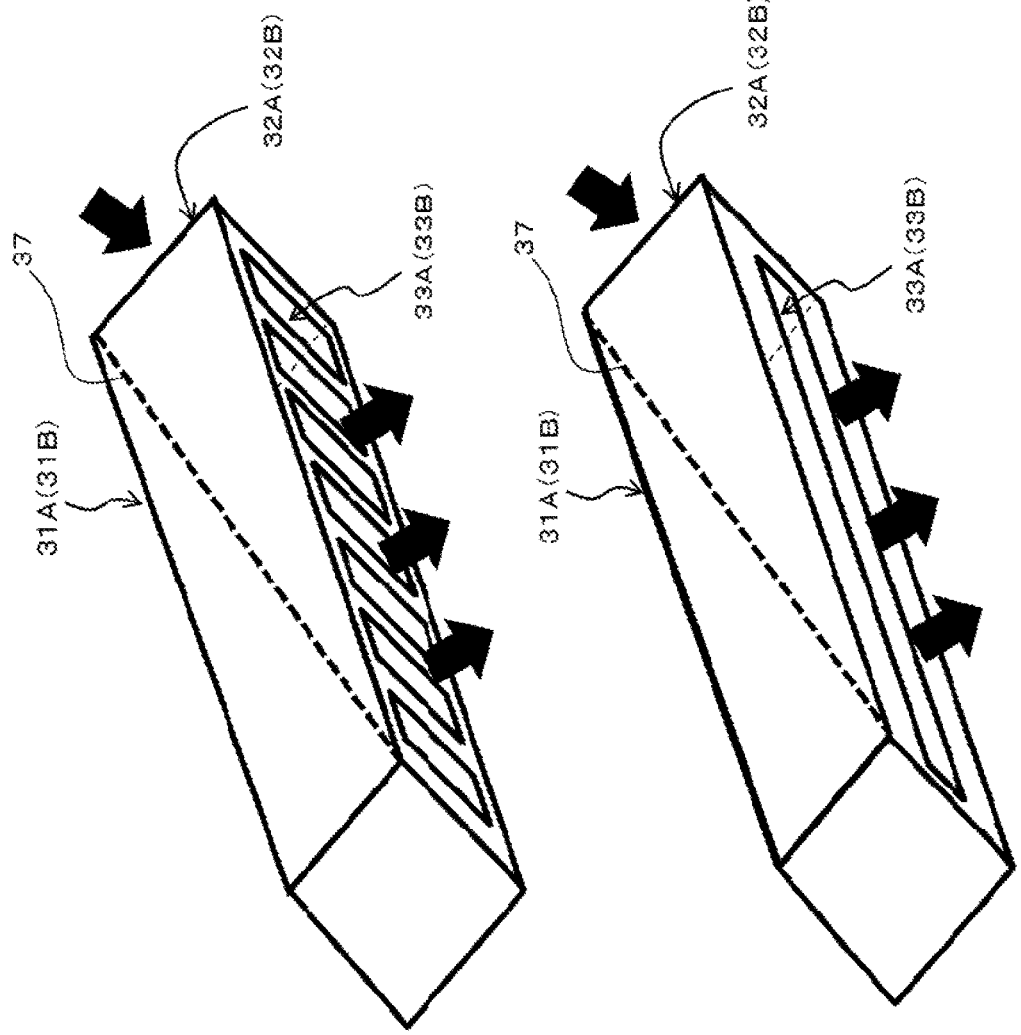
FIGS. 6A, 6B, 7A, 7B and 8 are schematic perspective views illustrating a configuration of a circulation duct provided in the data center according to the present embodiment.
Figure 7:
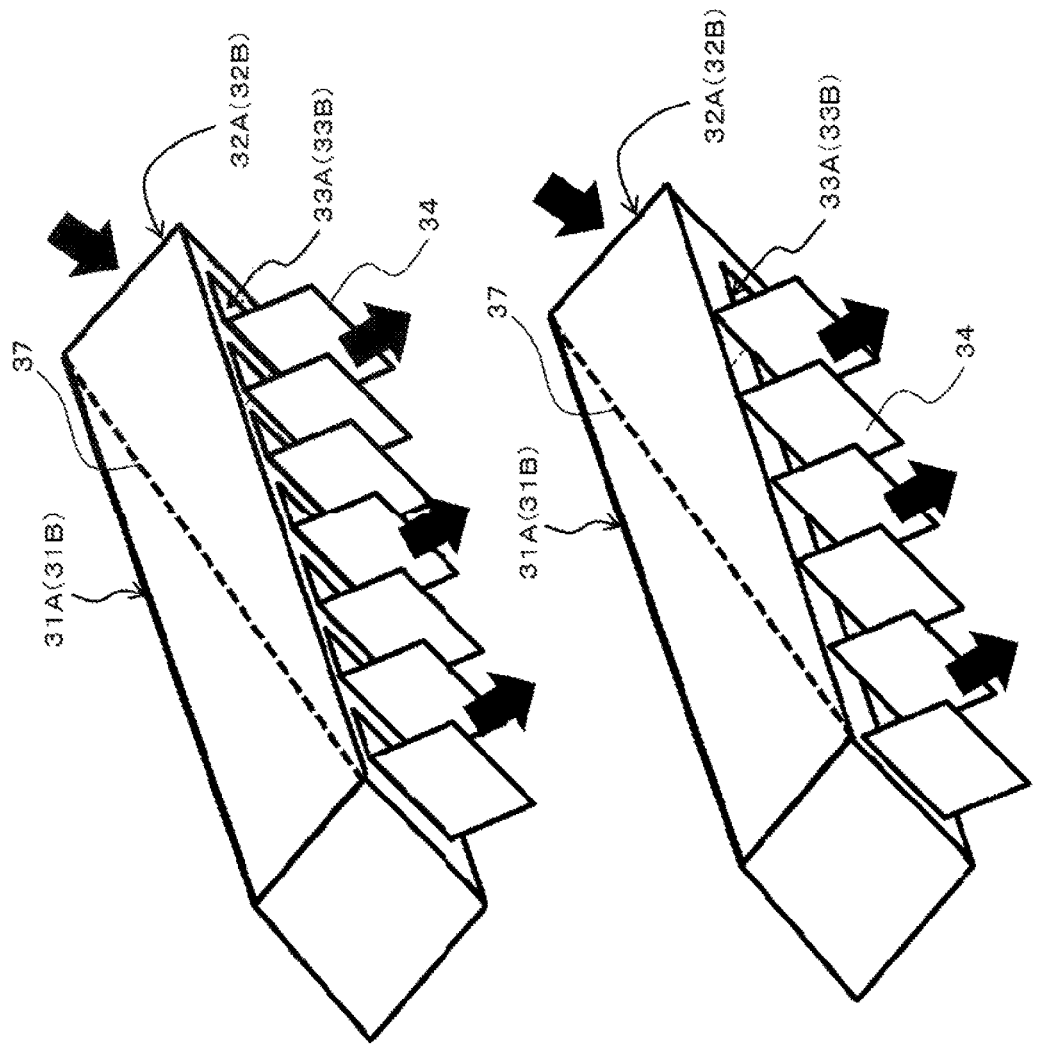

For example, as depicted in FIG. 5, the data center of the present embodiment includes an air conditioner room 1 in which an air conditioner 2 is provided and an electronic apparatus room 4 in which electronic apparatus 3 such as, for example, servers are provided. It is to be noted that the electronic apparatus room 4 is referred to sometimes as server room or ICT equipment room.

Here, not only the air conditioner 2 but also an air supply port 43 for introducing outside air, an outside air introduction duct 5 coupled with the air supply port 43 and the air conditioner 2 and a cold air supply duct 7 coupled with the air conditioner 2 and an air supply port 6 of the server room 4 are provided in the air conditioner room 1. Outside air is introduced into the air conditioner 2 through the air supply port 43 and the outside air introduction duct 5, and cold air for which temperature adjustment and moisture adjustment are to be performed by the air conditioner 2 is supplied into the server room 4 through the cold air supply duct 7 and the air supply port 6 of the server room 4. Here, the air conditioner 2 may include, for example, a cooling and heating coil 8, a dehumidification and humidification apparatus 9 and an air conditioning fan 10.

Further, also an exhaust port 11 for exhausting warm air and a warm air exhaust duct 13 coupled with the exhaust port 11 and an exhaust port 12 of the server room 4 are provided in the air conditioner room 1. Warm air is exhausted to the outside of the server room 4 through the exhaust port 12 of the server room 4 and the warm air exhaust duct 13. Further, the warm air exhaust duct 13 is branched such that part of warm air to be exhausted through the warm air exhaust duct 13 can be circulated to the air conditioner 2 so as to be mixed with outside air, and the branching portion is coupled with the air conditioner 2 and a damper 14 is provided at the branching portion.

Also a temperature sensor 15, a humidity sensor (not depicted) and an air conditioner and damper controller 16 are provided in the air conditioner room 1, and the air conditioner 2 and the damper 14 are controlled by the air conditioner and damper controller 16 based on the temperature detected by the temperature sensor 15 and the humidity detected by the humidity sensor. This is because the temperature and the humidity of the outside air vary. Here, the temperature sensor 15 and the humidity sensor are provided on the cold air supply duct 7 such that the temperature and the humidity of cold air to be supplied to the server room 4 are detected, respectively. It is to be noted that the air conditioner and damper controller 16 is referred to sometimes as air conditioner damper controller.

A plurality of rack rows 18 in each of which a plurality of racks (server racks) 17 individually having a plurality of servers 3 mounted therein are arranged in one row are provided in the server room 4. Here, each server 3 mounted in each rack row 18 inhales cold air from a space (cold aisle) 19 at one side of the rack row 18 by a server built-in fan (electronic apparatus built-in fan) and exhausts warm air to a space (hot aisle) 20 at the other side. It is to be noted that actually the servers 3 are mounted such that the air intake side and the air exhaust side are disposed in a reverse relationship between adjacent ones of the rack rows 18 so as to allow the cold aisle 19 and the hot aisle 20 to be shared by the adjacent rack rows 18.

Also the air supply port 6 for introducing cold air and a cold air supply duct 21 coupled with the air supply port 6 are provided at the ceiling side of the server room 4. Further, the cold air supply duct 21 has a portion (branching duct) 21A branching over the space 19 at the one side of each rack row 18. The branching duct 21A extends such that cold air blows out from the ceiling side to the space (cold aisle) 19 at the one side of the rack row 18. On the branching duct 21A, a damper 22 and a fan 23 are provided in the proximity of the branching portion.

Also temperature sensors 24 and 25, pressure sensors 26 and 27, a power sensor 42 (refer to FIG. 4) and a damper and fan controller (controller) 28 are provided in the server room 4 such that the damper 22 and the fan 23 are controlled by the damper and fan controller 28 on the basis of the temperature, pressure and power detected by the sensors.

Also the exhaust port 12 for exhausting warm air therethrough is provided at the ceiling side of the server room 4. Warm air exhausted to the space (hot aisle) 20 at the other side of each rack row 18 is exhausted from the ceiling side through the exhaust port 12.

Incidentally, it is not efficient only if warm air and outside air are mixed only by the air conditioner room 1, for example, in the winter in which outside air is preferably heated or the like, and it is desirable to reduce the power for operating the air conditioner 2 and the fans and achieve power saving.

Therefore, it seems recommendable to adopt the ceiling blowing system in which cold air blows out from the ceiling side into the space 19 at the one side of each rack row 18 and warm air exhausted into the space 20 at the other side of the rack row 18 is exhausted from the ceiling side such that part of warm air is circulated in the server room 4 in response to an outside air temperature, namely, part of warm air is circulated from the space 20 at the other side of the rack row 18 to the space 19 at the one side through the space over the rack row 18 so as to be mixed with cold air thereby to adjust the temperature (intake air temperature) of air to be supplied to the server.

However, under actual operation, the temperature or the air amount of exhaust air (warm air) exhausted from the racks 17 configuring the rack row 18 differ depending upon a mounted situation (provision situation) or an operating situation (operating amount; operating rate) of the servers 3 in the racks 17 configuring the rack row 18, and a distribution appears in the temperature or the air amount of the hot aisle 20. Therefore, also the temperature and the air amount of the circulated warm air differ, and a temperature distribution appears in the air to be supplied to the servers 3 mounted in the racks 17.

For example, if the heat generation amount of a server 3 mounted in a rack 17X that is part of the rack row 18 increases, then since the temperature of exhaust air exhausted from the rack 17X in which the server 3 having a high heat generation amount is mounted increases, also the temperature of warm air circulated passing over the rack 17X increases. Further, if the heat generation amount of a server mounted in the rack 17X configuring the rack row 18 increases, then since the air amount of exhaust air exhausted from the rack 17X in which the server 3 having a high heat generation amount is mounted increases, also the air amount of warm air circulated passing over the rack 17X increases. It is to be noted that the temperature and the air amount of cold air supplied from the cold air supply duct 21A to the servers 3 mounted in the racks 17 and 17X are uniform.

From an influence of such temperature or air amount of circulated warm air as described above, a distribution appears in the temperature of the cold aisle 19 and the temperature of air to be supplied to the servers 3 mounted in the rack 17X and individually having a high heat generation amount (temperature of air generated by mixing cold air and warm air; intake air temperature; rack intake air temperature) increases. Thus, a temperature distribution appears in the air to be supplied to the servers 3 mounted in the racks 17 and 17X.

If a temperature distribution appears in the air to be supplied to the servers 3 mounted in the racks 17 and 17X as described above, then efficient cooling becomes difficult and it becomes difficult to implement power saving.

For example, where the air amount of cold air for cooling the servers 3 individually having a high heat generation amount is increased, since the temperature of warm air to be circulated is high, the air amount of cold air is obliged to increase still further and the cooling efficiency is not high. Further, if the air amount of cold air is increased to an air amount demanded to cool the servers 3 individually having a high heat generation amount, then the other servers 3 are placed into an excessively cooled state. Therefore, since the power consumed for excessive cooling is useless, the increase of the air amount of cold air is not preferable to implement the power saving. Further, it may be recommendable, for example, to provide a plurality of fans 100 along the rack row 18 in the cold air supply duct 21A as depicted in FIG. 18 and individually control the number of rotations of the fans 100 such that a temperature distribution may not appear. However, this is not preferable in order to implement power saving because a plurality of fans 100 are demanded and the power for operating the fans 100 is demanded. Further, in this case, if a great amount of cold air is supplied to the servers 3 individually having a high heat generation amount, then cold air to be supplied to the remaining servers 3 decreases and it becomes difficult to effectively cool the servers 3.

Therefore, in the present embodiment, in order to implement the server room 4 in which the cooling efficiency is increased while power saving is implemented, such a configuration as described below is adopted.

It is to be noted here that the present embodiment is described taking, as an example, two rack rows 18A and 18B sandwiching one cold aisle 19A from among the plurality of rack rows 18. It is to be noted that hot aisles 20A and 20B exist at the opposite sides to the cold aisle 19A across the rack rows 18A and 18B, respectively.

Figure 3:
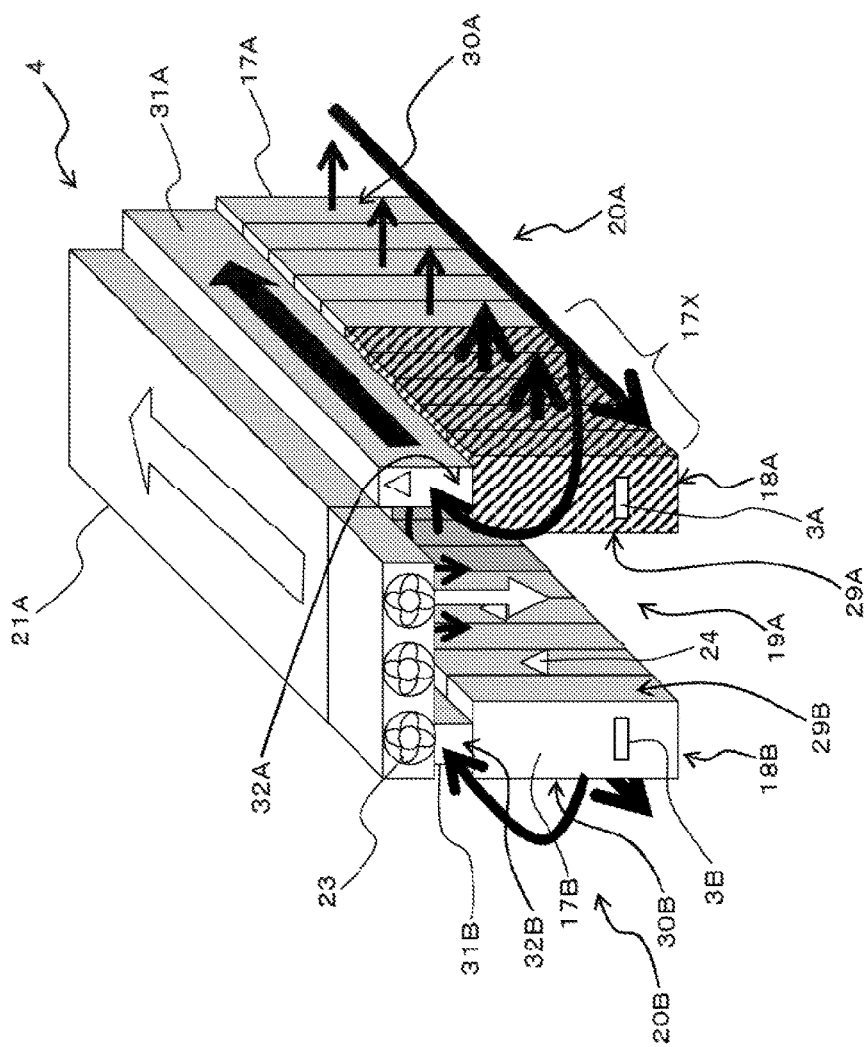
FIG. 3 is a schematic perspective view illustrating the data center according to the present embodiment.

In the present embodiment, as depicted in FIG. 3, the data center includes, in the server room 4, a first rack row 18A configured from a plurality of racks 17A in each of which a first server 3A is built and a second rack row 18B configured from a plurality of racks 17B in each of which a second server 3B is built.

Here, the first rack row 18A includes a first air intake face 29A for inhaling air to be supplied to the first server 3A and a first air exhaust face 30A for exhausting air exhausted from the first server 3A as first exhaust air (warm air).

Meanwhile, the second rack row 18B includes a second air intake face 29B for inhaling air to be supplied to the second server 3B and a second air exhaust face 30B for exhausting air exhausted from the second server 3B as second exhaust air (warm air).

In the second rack row 18B, the second air intake face 29B is disposed in an opposing relationship to the first air intake face 29A of the first rack row 18A.

It is to be noted that, while the first rack row 18A here is configured by juxtaposing the plurality of racks 17A, the configuration is not limited to this, and the entire first rack row 18A may be formed as one rack. In particular, the first servers individually built in the plurality of racks 17A configuring the first rack row 18A described above may be accommodated in a juxtaposed relationship in one rack having a size corresponding to that of the first rack row 18A. Such first rack row 18A and one rack having the size corresponding to that of the first rack row 18A as just described are referred to as first rack. Similarly, while the second rack row 18B here is configured by juxtaposing the plurality of racks 17B, the configuration is not limited to this, and the entire second rack row 18B may be formed as one rack. In particular, the second servers individually built in the plurality of racks 17B configuring the second rack row 18B described above may be accommodated in a juxtaposed relationship in one rack having a size corresponding to that of the second rack row 18B. Such second rack row 18B and one rack having the size corresponding to that of the second rack row 18B as just described are referred to as second rack.

Further, in the data center, the server room 4 includes a supply duct (cold air supply duct) 21A that is provided over the first space (cold aisle) 19A between the first air exhaust face 30A of the first rack row 18A and the second air intake face 29B of the second rack row 18B, and further includes an air intake fan 23. The supply duct 21A supplies air (cold air) inhaled by the air intake fan 23 to the first space 19.

Here, the supply duct 21A further includes a damper 22 (refer to FIG. 5) for introducing air inhaled by the air intake fan 23 to the first space 19A. In particular, the supply duct 21A is the branching duct described above (refer to FIG. 5), and the air intake fan 23 and the damper 22 are provided in the proximity of the branching portion. Further, the supply duct 21A extends along the first rack row 18A and the second rack row 18B, and a plurality of openings are provided as supply ports (cold air supply ports; blowing out ports) along an extending direction of the supply duct 21A such that cold air is blasted uniformly to the cold aisle 19A. It is to be noted that a baffle plate may be provided in each of the plurality of openings such that the direction of wind is determined.

Further, in the data center, the server room 4 includes a first circulation duct (warm air circulation duct) 31A that is provided so as to close up the first space 19A between an upper portion of the first rack row 18A and the supply duct 21A and allows the first exhaust air to be circulated to the first space 19A.

Here, the first circulation duct 31A is provided over the first rack row 18A along the first rack row 18A and partitions the hot aisle 20A and the cold aisle 19A from each other, and sucks and circulates the first exhaust air of the hot aisle 20A and then exhausts the first exhaust air to the cold aisle 19A. To this end, the first circulation duct 31A includes a first suction port 32A that is disposed at the end portion side of the first rack row 18A and sucks the first exhaust air and a first air exhaust port 33A (refer to FIGS. 6A and 6B) that is disposed at the first space 19A side and exhausts the first exhaust air.

Further, the first suction port 32A here is provided at the side of the server room 4 at which the exhaust port 12 is provided. In other words, the first suction port 32A and the exhaust port 12 are provided at the same end portion side of the first rack row 18A. Further, as depicted in FIG. 6A, a plurality of openings (slit ports; slits) are provided as the first air exhaust port 33A here along an extending direction of the first circulation duct 31A. It is to be noted that the configuration is not limited to this, and, for example, as depicted in FIG. 6B, one opening (slit port; slit) extending along an extending direction of the first circulation duct 31A may be provided as the first air exhaust port 33A. Or, as depicted in FIGS. 7A and 7B, a baffle plate 34 may be provided in each of the openings 33A such that the direction of wind is determined. It is to be noted that the shape, position, number and so forth of the openings provided as the first air exhaust ports 33A can be determined arbitrarily.

Figure 4:
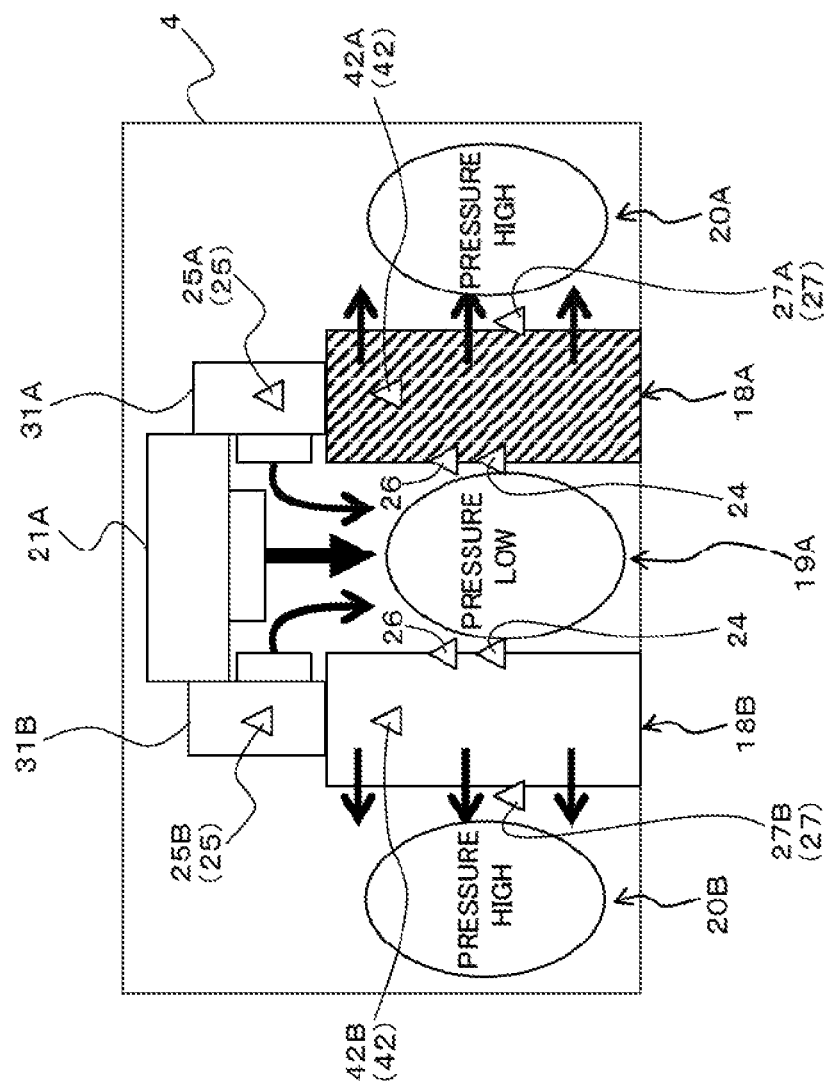
FIG. 4 is a schematic front elevational view illustrating the data center according to the present embodiment.

Further, warm air is automatically circulated through the first circulation duct 31A here by a pressure difference between the cold aisle 19A and the hot aisle 20A, and also the amount of circulation is determined automatically. In particular, a fan is not provided on the first circulation duct 31A, and warm air is automatically circulated through the first circulation duct 31A by a pressure difference between the cold aisle 19A and the hot aisle 20A, and also the amount of circulation is determined automatically. In particular, for example, by controlling the supply amount of cold air such that the pressure (static pressure) of the cold aisle 19A decreases while the pressure (static pressure) of the hot aisle 20A increases, namely, such that the pressure of the cold aisle 19A becomes lower than the pressure of the hot aisle 20A, warm air of the hot aisle 20A flows into the cold aisle 19A through the first circulation duct 31A and is circulated automatically so as to reduce the pressure difference as depicted in FIG. 4. Further, by controlling the supply amount of cold air on the basis of the temperature of the cold aisle 19A and the temperature of circulated warm air, the pressure difference between the cold aisle 19A and the hot aisle 20A varies and the circulation amount of warm air is determined automatically.

Similarly, the server room 4 of the data center includes a second circulation duct (warm air circulation duct) 31B that is provided so as to close up the first space 19A between the upper portion of the second rack row 18B and the supply duct 21A and circulates the second exhaust air to the first space 19A.

Here, the second circulation duct 31B is provided over the second rack row 18B along the second rack row 18B and partitions hot aisle 20B and the cold aisle 19A from each other, and sucks and circulates the second exhaust air of the hot aisle 20B and then exhausts the second exhaust air to the cold aisle 19A. To this end, the second circulation duct 31B includes a second suction port 32B that is disposed at the end portion side of the second rack row 18B and sucks the second exhaust air and a second air exhaust port 33B (refer to FIGS. 6A and 6B) that is disposed at the first space 19A side and exhausts the second exhaust air.

Further, the second suction port 32B here is provided at the side of the server room 4 at which the exhaust port 12 is provided. In particular, the second suction port 32B and the exhaust port 12 are provided at the same end portion side of the second rack row 18B. Further, as depicted in FIG. 6A, a plurality of openings (slit ports) are provided as the second air exhaust port 33B along an extending direction of the second circulation duct 31B. It is to be noted that the configuration is not limited to this, and, for example, as depicted in FIG. 6B, one opening (slit port) extending along an extending direction of the second circulation duct 31B may be provided as the second air exhaust port 33B. Or, as depicted in FIGS. 7A and 7B, a baffle plate 34 may be provided in each of the openings 33B such that the direction of wind is determined. It is to be noted that the shape, position, number and so forth of the openings provided as the second air exhaust port 33B can be determined arbitrarily.

Further, warm air here is automatically circulated through the second circulation duct 31B by a pressure difference between the cold aisle 19A and the hot aisle 20B, and also the amount of circulation is determined automatically. In particular, a fan is not provided on the second circulation duct 31B, and warm air is automatically circulated through the second circulation duct 31B by a pressure difference between the cold aisle 19A and the hot aisle 20B, and also the amount of circulation is determined automatically. In particular, for example, by controlling the supply amount of cold air such that the pressure (static pressure) of the cold aisle 19A decreases while the pressure (static pressure) of the hot aisle 20B increases, namely, such that the pressure (static pressure) of the cold aisle 19A becomes lower than the pressure of the hot aisle 20B, warm air of the hot aisle 20B flows into the cold aisle 19A through the second circulation duct 31B and is circulated automatically so as to reduce the pressure difference as depicted in FIG. 4. Further, by controlling the supply amount of cold air on the basis of the temperature of the cold aisle 19A and the temperature of circulated warm air, the pressure difference between the cold aisle 19A and the hot aisle 20B varies and the circulation amount of warm air is automatically determined.

Figure 2:
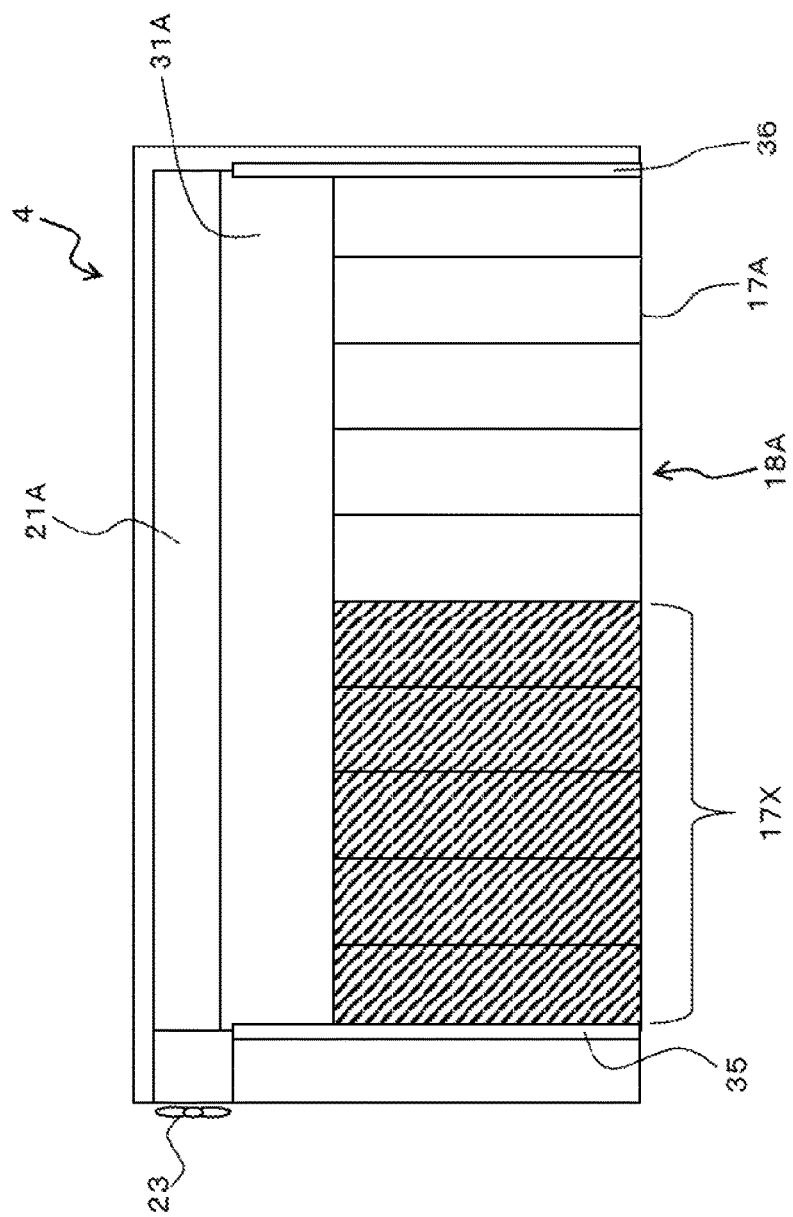
FIG. 2 is a schematic side elevational view illustrating the data center according to the present embodiment.

Further, as depicted in FIGS. 1 and 2, the server room 4 of the data center includes a first barrier 35 that closes up the first space 19A at one end portion of the first rack row 18A and the second rack row 18B, and a second barrier 36 that closes up the first space 19A at the other end portion opposite to the one end portion of the first rack row 18A and the second rack row 18B. Here, the first barrier 35 and the second barrier 36 may be provided only if the hot aisles 20A and 20B and the cold aisle 19A can be partitioned such that flow-in of warm air from the hot aisles 20A and 20B to the cold aisle 19A is suppressed, and the first barrier 35 and the second barrier 36 may be configured, for example, from such a material as a vinyl seat.

As described above, in the present embodiment, by partitioning the hot aisles 20A and 20B and the cold aisle 19A using the cold air supply duct 21A, first and second circulation ducts 31A and 31B and first and second barriers 35 and 36, the pressures in the hot aisles 20A and 20B and the cold aisle 19A are maintained. Consequently, by the pressure difference between the hot aisles 20A and 20B and the cold aisle 19A, warm air is automatically circulated from the hot aisles 20A and 20B to the cold aisle 19A through the first and second warm air circulation ducts 31A and 31B and also the circulation amount of warm air is automatically determined.

Since such a configuration as described above is provided, even if there is a variability in a mounted situation (installation situation) or an operating situation (operating amount; operating rate) of the servers 3A and 3B in the racks 17A and 17B configuring the first rack row 18A and the second rack row 18B, circulation warm air having a uniform temperature can be supplied to the first space (cold aisle) 19A between the first air intake face 29A of the first rack row 18A and the second air intake face 29B of the second rack row 18B. In particular, even if there is a variability in the temperature of exhaust air (warm air) exhausted from the racks 17A and 17B configuring the rack rows 18A and 18B, exhaust air exhausted from the racks 17A and 17B is mixed before the exhaust air is circulated from the hot aisles 20A and 20B through the circulation ducts 31A and 31B and is exhausted to the cold aisle 19A. Therefore, the circulation warm air having a uniform temperature can be supplied to the cold aisle 19A.

Consequently, the variability of the temperature of the cold aisle 19A, namely, of the temperature of air to be supplied to the servers 3A and 3B mounted in the racks 17A and 17B configuring the first rack row 18A and the second rack row 18B, can be suppressed.

As a result, since warm air whose temperature is uniformized is supplied to the racks 17A and 17B, a hotspot is reduced and uniformization of the temperature distribution generated in the first rack row 18A and the second rack row 18B can be achieved. Further, the variability between the highest temperature and the lowest temperature in the first rack row 18A and the second rack row 18B can be improved.

In this case, even if the temperature of exhaust air exhausted from the rack 17X in which the server 3 having a high heat generation amount is mounted is high, the exhaust air is mixed with exhaust air exhausted from the different racks 17A and 17B and having a low temperature before the exhaust air is circulated from the hot aisles 20A and 20B through the circulation duct 31A and 31B and is exhausted to the cold aisle 19A, and the temperature of the circulation warm air is uniformized. Consequently, the temperature of warm air to be circulated to the rack 17X in which the server 3 having a high heat generation amount is mounted can be lowered. As a result, the temperature (intake air temperature) of air to be supplied to the server 3 of a high heat generation amount mounted in the rack 17X can be decreased, and effective cooling can be achieved. In particular, where the temperature of exhaust air exhausted from the rack 17X in which the server 3 having a high heat generation amount is mounted is high, it is a common countermeasure to increase the air amount of cold air to try to decrease the temperature of air to be supplied to the server 3 of a high heat generation amount mounted in the rack 17X. However, even if the air amount of cold air is increased, it is difficult to achieve effective cooling in the state in which the temperature of circulated warm air to be mixed with the cold air remains high. Therefore, it is made possible to achieve effective cooling by lowering the temperature of the circulated warm air in such a manner as described above. Further, since the air amount of cold air is not increased and a plurality of fans (refer to FIG. 18) are not provided in a cold air supply duct along a rack row, power saving can be implemented.

Incidentally, it is preferable to configure the first circulation duct 31A and the second circulation duct 31B configured as described above such that a restriction structure 37 for restricting a flow path is provided in the inside as depicted in FIGS. 6A, 6B, 7A and 7B.

Consequently, even if there is a variability in a mounted situation (installation situation) or an operating situation (operating amount; operating rate) of the servers 3A and 3B in the racks 17A and 17B configuring the first rack row 18A and the second rack row 18B, circulation warm air having a uniform air amount (and temperature) can be supplied to the cold aisle 19A. In particular, even if there is a variability in the air amount (and temperature) of exhaust air (warm air) exhausted from the racks 17A and 17B configuring the rack rows 18A and 18B, circulation warm air having a uniform air amount (and temperature) can be supplied to the cold aisle 19A. Consequently, a variability of the temperature of the cold aisle 19A, namely, of the temperature of air to be supplied to the servers 3A and 3B mounted in the racks 17A and 17B configuring the first rack row 18A and the second rack row 18B, can be suppressed. As a result, since warm air having a uniform air amount (and temperature) is supplied uniformly to the racks 17A and 17B, the hotspot is reduced and uniformization of a temperature distribution generated in the first rack row 18A and the second rack row 18B can be achieved. Therefore, a variability between the highest temperature and the lowest temperature in the first rack row 18A and the second rack row 18B can be improved.

Here, a restriction inclination plate is provided as the restriction structure 37. In particular, the restriction inclination plate is provided in the inside of the circulation ducts 31A and 31B such that the flow path in the inside of the first circulation duct 31A and the second circulation duct 31B is great at the suction ports 32A and 32B but is small at the side spaced away from the suction ports 32A and 32B. As a result, the flow path in the inside is restricted.

Here, in what manner the restriction inclination plate 37 is provided in the first circulation duct 31A and the second circulation duct 31B is determined taking reduction of the air amount by exhaustion of circulation warm air to the cold aisle 19A and pressure loss suffering from the flow path when circulation warm air flows in the ducts 31A and 31B into consideration.

Figure 8:
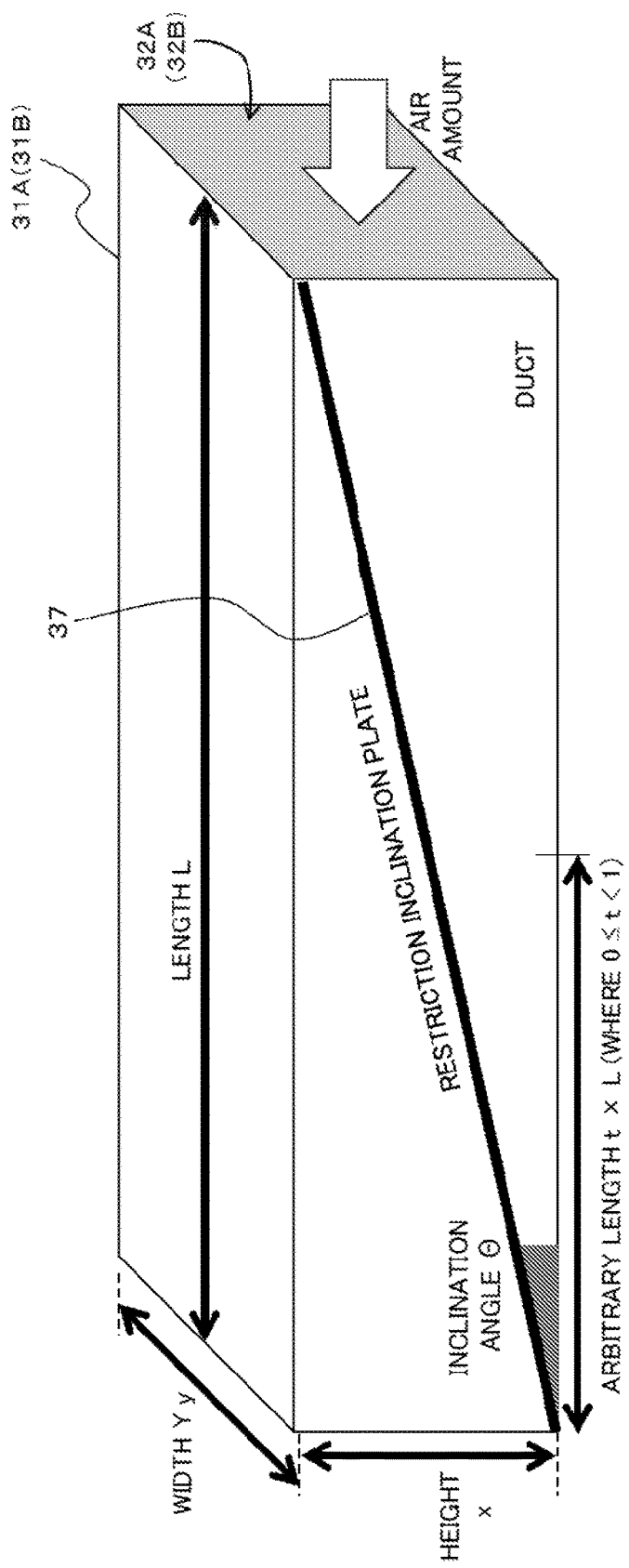
Figure 9:
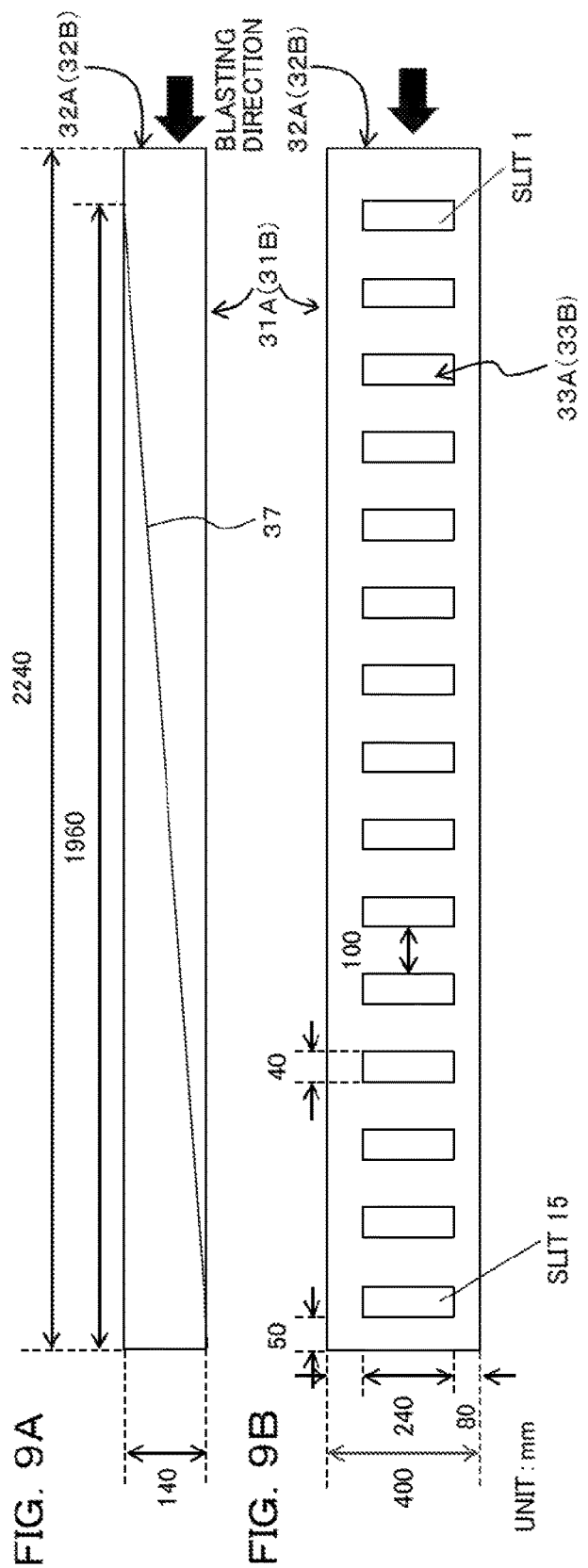

In particular, as depicted in FIG. 8, the length, width and height of each of the ducts 31A and 31B are represented L, y and x, respectively, and an arbitrary position from the opposite side to the suction ports 32A and 32B of the ducts 31A and 31B and an inclination angle of the restriction inclination plate 37 are represented by t×L (0≤t<1) and θ, respectively. In this instance, the inclination angle θ of the restriction inclination plate 37 is calculated by an expression given below such that the pressure loss in the suction ports 32A and 32B of the ducts 31A and 31B and the pressure loss at the arbitrary position in the ducts 31A and 31B become equal to each other. Thus, the restriction inclination plate 37 may be provided so as to have the inclination angle θ in the ducts 31A and 31B.

$$\frac{x+y}{x^3} = \frac{(tL\tan\theta + y)(1-t^2)}{t^3 L\tan\theta}$$

Figure 10:
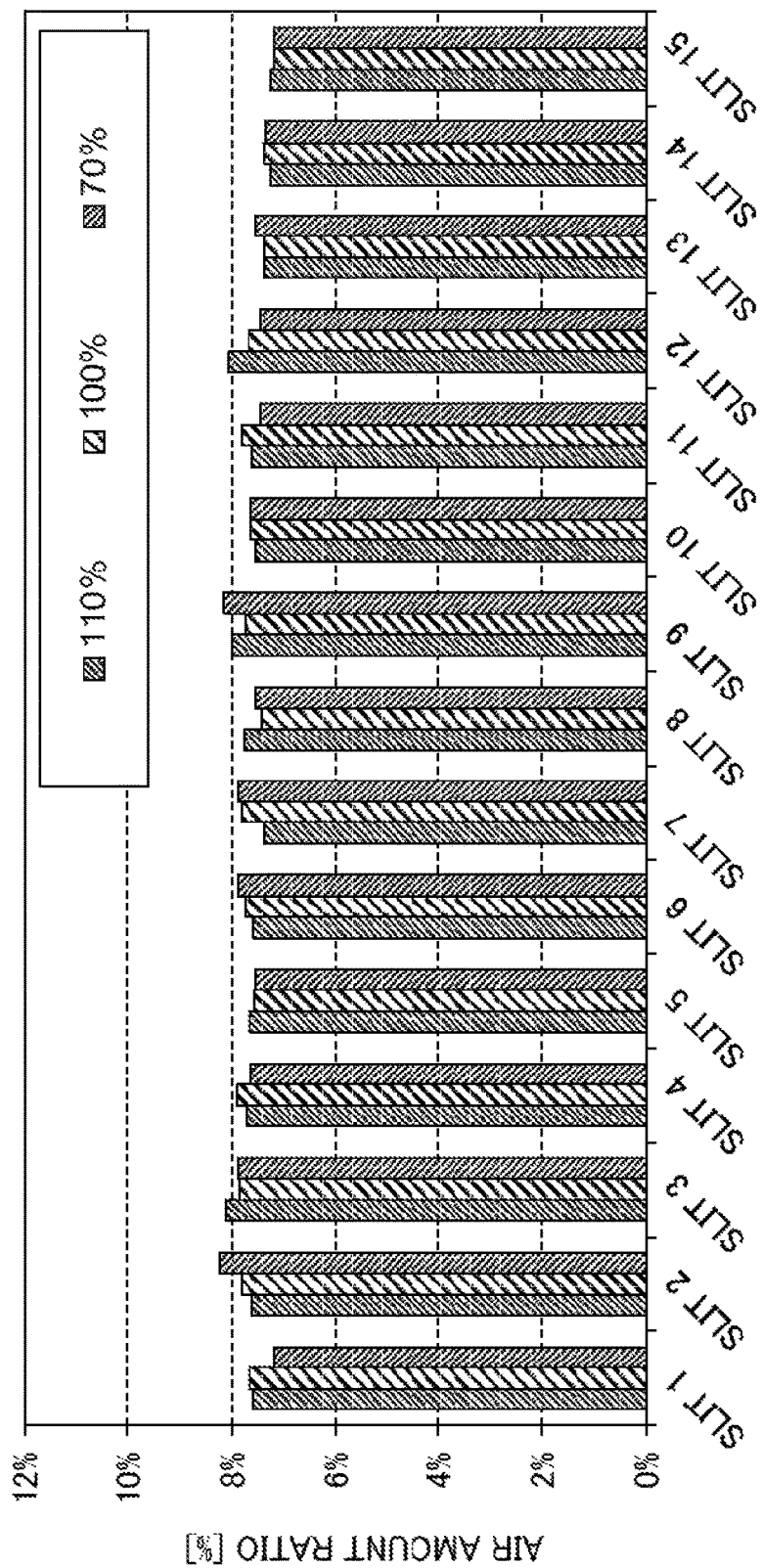
FIG. 10 is a view depicting a result when an amount of air blowing out from slits of the circulation duct provided in the data center according to the present embodiment is measured.

For example, the size of the ducts 31A and 31B is set as depicted in FIGS. 9A and 9B, 15 slits are provides as exhaust ports 33A and 33B, an inclination angle is calculated in such a manner as described above, and the restriction inclination plate 37 is provided with the inclination angle θ in the inside of the ducts 31A and 31B. Then, the amount of air flowing out from the slits was measured by setting the air amount to 6.1 m$^3$/min (corresponding to 110%), 5.5 m$^3$/min (rated) and 4.1 m$^3$/min (corresponding to 75%). Thus, such a result as depicted in FIG. 10 was obtained. It is to be noted that numbers from 1 to 15 are applied to the slits in order from the side of the suction ports 32A and 32B of the ducts 31A and 31B.

By calculating the inclination angle in such a manner as described above and providing the restriction inclination plate 37 with the inclination angle in the ducts 31A and 31B as depicted in FIG. 10, the amount of air flowing out from the slits can be uniformized without relying upon the magnitude of the amount of air flowing in the ducts 31A and 31B. By calculating the inclination angle and providing the restriction inclination plate 37 with the inclination angle in the ducts 31A and 31B in such a manner as described above, the amount of air to flow out from the slits can be uniformized without providing a damper, a fan or the like in each slit.

It is to be noted, although the restriction structure 37 here is provided in both of the first circulation duct 31A and the second circulation duct 31B, provision of the restriction structure 37 is not limited to this and the restriction structure 37 may be provided in only one of the first and second circulation ducts 31A and 31B. Further, while the restriction structure 37 here is provided in the first circulation duct 31A and the second circulation duct 31B, provision of the restriction structure 37 is not limited this and a similar restriction structure may be provided, for example, also in the cold air supply duct 21A.

Figure 11:
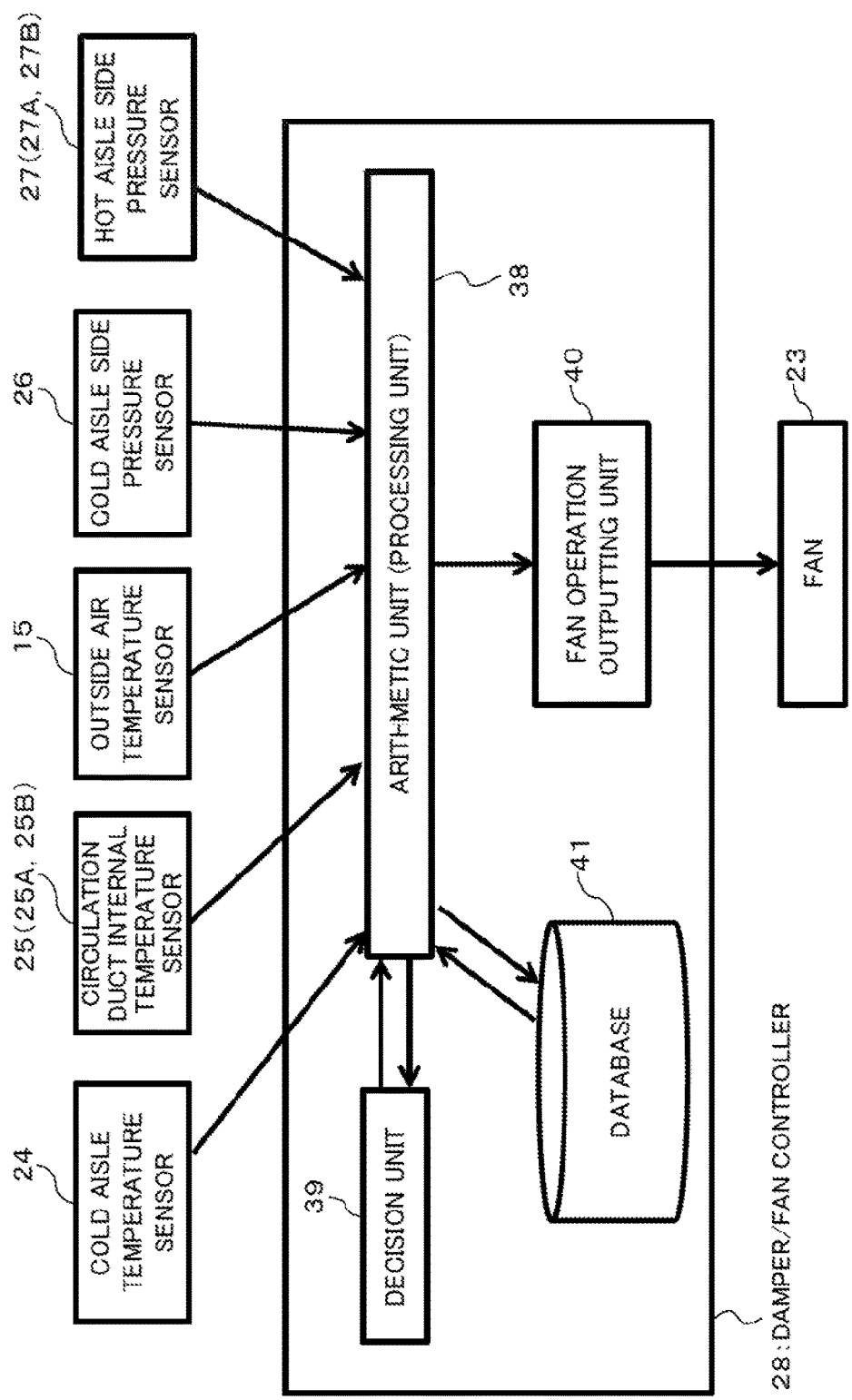
FIG. 11 is a block diagram illustrating the data center according to the present embodiment.

Incidentally, in the present embodiment, the first pressure sensor 26 for detecting the pressure of the first space (cold aisle) 19A is provided as depicted in FIG. 4 and the damper and fan controller 28 controls the air intake fan 23 on the basis of the pressure detected by the first pressure sensor 26 as depicted in FIG. 11. It is to be noted that the damper and fan controller 28 is referred to sometimes as fan controller.

In particular, as depicted in FIG. 4, the first pressure sensor (cold aisle side pressure sensor) 26 for detecting the pressure of the first space (cold aisle) 19A, a second pressure sensor (hot aisle side pressure sensor) 27A for detecting the pressure of the second space (hot aisle) 20A at the opposite side to the first space (cold aisle) 19A across the first rack row 18A and a third pressure sensor (hot aisle side pressure sensor) 27B for detecting the pressure of a third space (hot aisle) 20B at the opposite side to the first space 19A across the second rack row 18B are provided. As depicted in FIG. 11, the fan controller 28 controls the air intake fan 23 on the basis of the pressures detected by the first pressure sensor 26, second pressure sensor 27A and third pressure sensor 27B.

Here, when the pressure detected by the first pressure sensor 26 becomes higher than the pressure detected by the second pressure sensor 27A or when the pressure detected by the first pressure sensor 26 becomes higher than the pressure detected by the third pressure sensor 27B, the fan controller 28 controls the air intake fan 23 such that the number of rotations of the air intake fan 23 is decreased.

It is to be noted that the number of the first pressure sensors 26, second pressure sensors 27A and third pressure sensors 27B may individually be a single or plural number. For example, the pressure sensor may be provided one by one at both sides of the rack rows 18A and 18B, or a plurality of pressure sensors may be provided individually at both sides of the rack rows 18A and 18B. In particular, the number of measurement points may be one or more and is not limited especially. Further, where a plurality of measurement points are provided, an average value among the measurement points may be adopted. Further, the pressure sensors may be provided such that they are juxtaposed at the same height and the same position across the rack row, and may be provided such that the dynamic pressure is not detected.

Further, in the present embodiment, the first temperature sensor 24 for detecting the temperature of the first space (cold aisle) 19A is provided as depicted in FIG. 4, and the fan controller 28 controls the air intake fan 23 on the basis of the temperature detected by the first temperature sensor 24 as depicted in FIG. 11.

In particular, as depicted in FIG. 4, the first temperature sensor (cold aisle temperature sensor) 24 for detecting the temperature of the first space (cold aisle) 19A, a second temperature sensor (first circulation duct temperature sensor) 25A for detecting the temperature in the first circulation duct 31A, a third temperature sensor (second circulation duct temperature sensor) 25B for detecting the temperature in the second circulation duct 31B and a fourth temperature sensor (outside air temperature sensor) 15 (refer to FIG. 5) for detecting the temperature of outside air (outside air temperature) are provided. As depicted in FIG. 11, the fan controller 28 controls the air intake fan 23 on the basis of the temperatures detected by the first temperature sensor 24, second temperature sensor 25A, third temperature sensor 25B and fourth temperature sensor 15.

Here, when it is decided on the basis of the temperatures detected by the first temperature sensor 24, second temperature sensor 25A and fourth temperature sensor 15 that the circulation amount of the first exhaust air is insufficient or when is decided on the basis of the temperatures detected by the first temperature sensor 24, third temperature sensor 25B and fourth temperature sensor 15 that the circulation amount of the second exhaust air is insufficient, the fan controller 28 controls the air intake fan 23 such that the number of rotations of the air intake fan 23 is decreased. On the other hand, when it is decided on the basis of the temperatures detected by the first temperature sensor 24, second temperature sensor 25A and fourth temperature sensor 15 that the circulation amount of the first exhaust air is excessive or when it is decided on the basis of the temperatures detected by the first temperature sensor 24, third temperature sensor 25B and fourth temperature sensor 15 that the circulation amount of the second exhaust air is excessive, the fan controller 28 controls the air intake fan 23 such that the number of rotations of the air intake fan 23 is increased.

It is to be noted that the number of cold aisle temperature sensors 24 may be a single or plural number. For example, the temperature sensor may be provided one by one in each of the cold aisles or a plurality of temperature sensors may be provided in each of the cold aisles. In other words, the number of measurement points may be one or more for each cold aisle, and the number of measurement points is not limited especially. Further, where there are a plurality of measurement points in the same cold aisle, the highest temperature may be selected and used from among the temperatures detected at all of the measurement points.

Further, the outside air temperature sensor 15 here is provided in the cold air supply duct 7 of the air conditioner room 1 so as to detect the temperature of cold air to be supplied to the server room 4. It is to be noted that provision of the outside air temperature sensor 15 is not limited to this, and the outside air temperature sensor 15 may be provided at a different location.

Therefore, the fan controller 28 includes, for example, a controller or a computer, and includes, as functions thereof, an arithmetic unit 38, a decision unit 39 and a fan operation outputting unit 40 as depicted in FIG. 11.

Here, the arithmetic unit 38 acquires pressures (pressure data; pressure information) detected by the pressure sensors from the cold aisle side pressure sensor 26 and the hot aisle side pressure sensors 27 (27A, 27B). It is to be noted that each pressure sensor is referred to sometimes as pressure detection unit.

Further, the arithmetic unit 38 acquires temperatures (temperature data; temperature information) detected by the temperature sensors from the cold aisle temperature sensor 24, first circulation duct temperature sensor 25A, second circulation duct temperature sensor 25B and outside air temperature sensor 15. It is to be noted that each temperature sensor is referred to sometimes as temperature detection unit.

Further, the arithmetic unit 38 calculates a circulation rate on the basis of temperatures detected by the cold aisle temperature sensor 24, first circulation duct temperature sensor 25A, second circulation duct temperature sensor 25B and outside air temperature sensor 15 for each set including the cold aisle 19A and the hot aisles 20A and 20B positioned at the opposite sides of the cold aisle 19A. In particular, the circulation rate of the first circulation duct 31A is calculated on the basis of the temperatures detected by the cold aisle temperature sensor 24, first circulation duct temperature sensor 25A and outside air temperature sensor 15, and the circulation rate of the second circulation duct 31B is calculated on the basis of the temperatures detected by the cold aisle temperature sensor 24, second circulation duct temperature sensor 25B and outside air temperature sensor 15.

Here, the circulation rate is calculated, for example, using the following calculation expression.

$$\text{circulation rate} = \frac{\text{cold aisle temperature} - \text{ouside air temperature}}{\text{circulation duct tempreture} - \text{outside air temperature}}$$

It is to be noted that, where a plurality of cold aisle temperature sensors 24 are provided for each cold aisle, in order to calculate the circulation rate, the arithmetic unit 38 may select the highest temperature from among the temperatures detected by the plurality of cold aisle temperature sensors 24 and use the selected temperature as the temperature detected by the cold aisle temperature sensor 24.

For each set including the cold aisle 19A and the hot aisles 20A and 20B positioned at both sides of the cold aisle 19A, the decision unit 39 decides whether or not the pressure detected by the cold aisle side pressure sensor 26 has become higher than the pressures detected by the hot aisle side pressure sensors 27 (27A, 27B). In other words, the decision unit 39 decides whether or not the pressure detected by the cold aisle side pressure sensor 26 has become higher than the pressure detected by the hot aisle side pressure sensor 27A and whether or not the pressure detected by the cold aisle side pressure sensor 26 has become higher than the pressure detected by the hot aisle side pressure sensor 27B.

It is to be noted that the decision is not limited to this, and, for example, the arithmetic unit 38 may subtract the pressures detected by the hot aisle side pressure sensors 27 (27A, 27B) from the pressure detected by the cold aisle side pressure sensor 26 to calculate a pressure difference and it may be decided by the decision unit 39 whether or not the pressure difference is a positive pressure. In this case, the function of the arithmetic unit 38 for calculating the pressure difference is referred to as pressure difference calculation unit or cold aisle-hot aisle pressure difference calculation unit.

Further, for each set including the one cold aisle 19A and the hot aisles 20A and 20B positioned at the opposite sides of the cold aisle 19A, the decision unit 39 decides whether or not the circulation rate (circulation rate at present) calculated by the arithmetic unit 38 is higher than a reference circulation rate stored in the database 41. In particular, the decision unit 39 decides whether or not the circulation rate of the first circulation duct 31A calculated by the arithmetic unit 38 is higher than the reference circulation rate stored in the database and whether or not the circulation rate of the second circulation duct 31B calculated by the arithmetic unit 38 is higher than the reference circulation rate stored in the database 41. Here, the circulation rate with respect to the outside air temperature, namely, such a correspondence table (list) of the outside air temperature and the circulation rate as depicted in FIG. 12, is stored as the reference circulation rate in the database 41.

The fan operation outputting unit 40 outputs a control instruction to the air intake fan 23 on the basis of a result of the decision by the decision unit 39.

Here, when it is decided by the decision unit 39 that, for each set including the one cold aisle 19A and the hot aisles 20A and 20B positioned at opposite sides of the cold aisle 19A, the pressure detected by the cold aisle side pressure sensor 26 becomes higher than the pressure detected by the hot aisle side pressure sensor 27A or when it is decided that the pressure detected by the cold aisle side pressure sensor 26 becomes higher than the pressure detected by the hot aisle side pressure sensors 27B, it is considered that cold air (outside air) is supplied excessively. Therefore, the control instruction is outputted to the air intake fan 23 such that the number of rotations of the air intake fan 23 is lowered on the basis of the instruction from the arithmetic unit 38.

Further, when it is decided by the decision unit 39 that, for each set including the one cold aisle 19A and the hot aisles 20A and 20B positioned at the opposite sides of the cold aisle 19A, the circulation rate of the first circulation duct 31A calculated by the arithmetic unit 38 is higher than the reference circulation rate stored in the database 41, namely, when it is decided that the circulation amount of warm air (first exhaust air) circulated in the first circulation duct 31A is insufficient, or when it is decided that the circulation rate of the second circulation duct 31B calculated by the arithmetic unit 38 is higher than the reference circulation rate stored in the database 41, namely, when it is decided that the circulation amount of warm air (second exhaust air) circulated in the second circulation duct 31B is insufficient, then the control instruction is outputted to the air intake fan 23 such that the number of rotations of the air intake fan 23 is lowered on the basis of the instruction from the arithmetic unit 38.

On the other hand, when it is decided by the decision unit 39 that, for each set including the one cold aisle 19A and the hot aisles 20A and 20B positioned at the opposite sides of the cold aisle 19A, the circulation rate of the first circulation duct 31A calculated by the arithmetic unit 38 is not higher than the reference circulation rate stored in the database 41, namely, when it is decided that the circulation amount of warm air (first exhaust air) circulated in the first circulation duct 31A is excessive, or when it is decided that the circulation rate of the second circulation duct 31B calculated by the arithmetic unit 38 is not higher than the reference circulation rate stored in the database 41, namely, when it is decided that the circulation amount of warm air (second exhaust air) circulated in the second circulation duct 31B is excessive, the control instruction is outputted to the air intake fan 23 such that the number of rotations of the air intake fan 23 is raised on the basis of the instruction from the arithmetic unit 38.

It is to be noted that, where a plurality of cold aisle temperature sensors 24 are provided for each cold aisle, when the arithmetic unit 38 selects the highest temperature from among the temperatures detected by the plurality of cold aisle temperature sensors 24, the decision unit 39 decides, for each set including the one cold aisle 19A and the hot aisles 20A and 20B positioned at the opposite sides of the cold aisle 19A, whether or not the highest temperature satisfies an installation requirement. Then, when it is decided that the highest temperature does not satisfy the installation requirement, the arithmetic unit 38 and the decision unit 39 may perform the processes described above, but when it is decided that the highest temperature satisfies the installation requirement, the arithmetic unit 38 and the decision unit 39 may not perform the processes described above.

Further, while the pressure of the cold aisle 19A and the pressure of the hot aisle 20A and 20B are detected by the pressure sensors 26, 27A and 27B and the air intake fan 23 here is controlled on the basis of the difference between the detected pressures, the control of the air intake fan 23 is not limited to this. For example, the following control may be applied. In particular, the pressure difference between the cold aisle 19A and the hot aisles 20A and 20B corresponds to the difference between the air amount of cold air supplied to the cold aisle 19A, the air amount depending upon the number of rotations of the fan 23 provided in the cold air supply duct 21A, and the air amount of warm air exhausted to the hot aisles 20A and 20B, the air amount depending upon the number of rotations of a server built-in fan. Therefore, in order to control the supply amount of cold air such that the pressure of the cold aisle 19A becomes equal to or lower than the pressures of the hot aisles 20A and 20B, the number of rotations (cold air amount) of the air intake fan 23 provided in the cold air supply duct 21A may be controlled so as to be equal to or smaller than the number of rotations (warm air amount) of the server built-in fan.

Further, the damper 22 may be controlled in the following manner. In particular, a first power sensor 42A (refer to FIG. 4) that is provided in the first rack row 18A and detects the power supplied to the first server 3A and a second power sensor 42B (refer to FIG. 4) that is provided in the second rack row 18B and detects the power supplied to the second server 3B are provided such that the damper 22 is controlled by the damper and fan controller 28 on the basis of the power detected by the first power sensor 42A and the power detected by the second power sensor 42B (refer to FIG. 5). It is to be noted that the damper and fan controller 28 is referred to sometimes as damper controller. In particular, when the power detected by the first power sensor 42A and the power detected by the second power sensor 42B are zero, the damper and fan controller 28 may perform control for closing the damper 22 and besides the damper and fan controller 28 that controls the air intake fan 23 may perform control for stopping the air intake fan 23.

Now, a flow of control by the fan controller 28 according to the present embodiment is described with reference to FIG. 13.

It is to be noted that description is given here taking a case in which a plurality of cold aisle temperature sensors 24 are provided for each cold aisle as an example.

As depicted in FIG. 13, the fan controller 28 first acquires a pressure detected by the cold aisle side pressure sensor 26 and a pressure detected by the hot aisle side pressure sensors 27 (27A, 27B) by the arithmetic unit 38 (step S1).

Then, the fan controller 28 decides, by the decision unit 39 thereof, for each set including the cold aisle 19A and the hot aisles 20A and 20B positioned at both sides of the cold aisle 19A, whether or not the pressure detected by the cold aisle side pressure sensor 26 is higher than the pressure detected by the hot aisle side pressure sensors 27A and whether or not the pressure detected by the cold aisle side pressure sensor 26 is higher than the pressure detected by the hot aisle side pressure sensors 27B (step S2).

As a result of the decision, when it is decided, for each set including the cold aisle 19A and the hot aisles 20A and 20B positioned at both sides of the cold aisle 19A, that the pressure detected by the cold aisle side pressure sensor 26 is higher than the pressure detected by the hot aisle side pressure sensors 27A or when it is decided that the pressure detected by the cold aisle side pressure sensor 26 is higher than the pressure detected by the hot aisle side pressure sensors 27B, the processing advances to the YES route. Then, since it is considered that cold air (outside air) is supplied excessively, the fan controller 28 outputs, by the arithmetic unit 38 and the fan operation outputting unit 40 thereof, a control instruction to the air intake fan 23 such that the number of rotations of the air intake fan 23 is lowered (step S3).

On the other hand, when it is decided, for each set including the cold aisle 19A and the hot aisles 20A and 20B positioned at both sides of the cold aisle 19A, that the pressure detected by the cold aisle side pressure sensor 26 is not higher than the pressure detected by the hot aisle side pressure sensors 27A or when it is decided that the pressure detected by the cold aisle side pressure sensor 26 is not higher than the pressure detected by the hot aisle side pressure sensors 27B, the processing advances to the NO route. Then, the fan controller 28 acquires, by the arithmetic unit 38 thereof, the temperatures detected by the plurality of cold aisle temperature sensors 24 (step S4), and selects the highest temperature from among the acquired temperatures for each cold aisle (step S5).

Then, the fan controller 28 decides, by the decision unit 39 thereof, whether or not the highest temperature satisfies an installation requirement for each cold aisle (step S6). If it is decided that the highest temperature does not satisfy the installation requirement, then the processing advances to the NO route and decides, by the arithmetic unit 38 thereof, that, since the installation requirement is not satisfied, a change is demanded (step S7), whereafter the processing advances to step S9. On the other hand, when it is decided that the highest temperature satisfies the installation requirement, the processing advances to the YES route and it is decided by the arithmetic unit 38 that, since the installation requirement is satisfied, a change is not demanded (step S8) and then the processing is ended.

At step S9, the fan controller 28 acquires, by the arithmetic unit 38 thereof, the temperatures detected by the remaining temperature sensors, namely, by the first circulation duct temperature sensor 25A, second circulation duct temperature sensor 25B and outside air temperature sensor 15, and calculates a circulation rate on the basis of the acquired temperatures and the highest temperature used as the temperatures detected by the cold aisle temperature sensor 24. Here, the circulation rate of the first circulation duct 31A is calculated on the basis of the temperatures detected by the cold aisle temperature sensor 24, first circulation duct temperature sensor 25A and outside air temperature sensor 15, and the circulation rate of the second circulation duct 31B is calculated on the basis of the temperatures detected by the cold aisle temperature sensor 24, second circulation duct temperature sensor 25B and outside air temperature sensor 15.

Then, the fan controller 28 extracts the reference circulation rate stored in the database 41 by the arithmetic unit 38 thereof (step S10).

Then, the fan controller 28 decides, by the decision unit 39 thereof, for each set including the one cold aisle 19A and the hot aisles 20A and 20B positioned at the opposite sides of the cold aisle 19A, whether or not the circulation rate (current circulation rate) calculated by the arithmetic unit 38 is higher than the reference circulation rate stored in the database 41 (step S11). Here, it is decided whether or not the circulation rate of the first circulation duct 31A calculated by the arithmetic unit 38 is higher than the reference circulation rate stored in the database 41 and whether or not the circulation rate of the second circulation duct 31B calculated by the arithmetic unit 38 is higher than the reference circulation rate stored in the database 41.

when it is decided as a result of the decision that, for each set including the cold aisle 19A and the hot aisles 20A and 20B positioned at opposite sides of the cold aisle 19A, the circulation rate of the first circulation duct 31A calculated by the arithmetic unit 38 is higher than the reference circulation rate stored in the database 41, namely, when it is decided that the circulation rate of warm air (first exhaust air) circulated in the first circulation duct 31A is insufficient or when it is decided that the circulation rate of the second circulation duct 31B calculated by the arithmetic unit 38 is higher than the reference circulation rate stored in the database 41, namely, when it is decided that the circulation rate of warm air (second exhaust air) circulated in the second circulation duct 31B is insufficient, the processing advances to the NO route. Then, a control instruction is outputted to the air intake fan 23 by the arithmetic unit 38 and the fan operation outputting unit 40 such that the number of rotations of the air intake fan 23 is lowered (step S12), whereafter the processing is ended.

On the other hand, when it is decided, for each set including the cold aisle 19A and the hot aisles 20A and 20B positioned at the opposite sides of the cold aisle 19A, that the circulation rate of the first circulation duct 31A calculated by the arithmetic unit 38 is not higher than the reference circulation rate stored in the database 41, namely, when it is decided that the circulation rate of warm air (first exhaust air) circulated in the first circulation duct 31A is excessive or when it is decided that the circulation rate of the second circulation duct 31B calculated by the arithmetic unit 38 is not higher than the reference circulation rate stored in the database 41, namely, when it is decided that the circulation rate of warm air (second exhaust air) circulated in the second circulation duct 31B is excessive, the processing advances to the YES route. Then, a control instruction is outputted to the air intake fan 23 by the arithmetic unit 38 and the fan operation outputting unit 40 such that the number of rotations of the air intake fan 23 is raised (step S13), whereafter the processing is ended.

Accordingly, with the present embodiment, there is an advantage that the cooling efficiency can be improved while power saving is implemented.

Here, when thermal-liquid analysis was performed in order to confirm a reduction effect of a temperature distribution of the intake air temperature, such a result as described below was obtained.

Figure 14B:
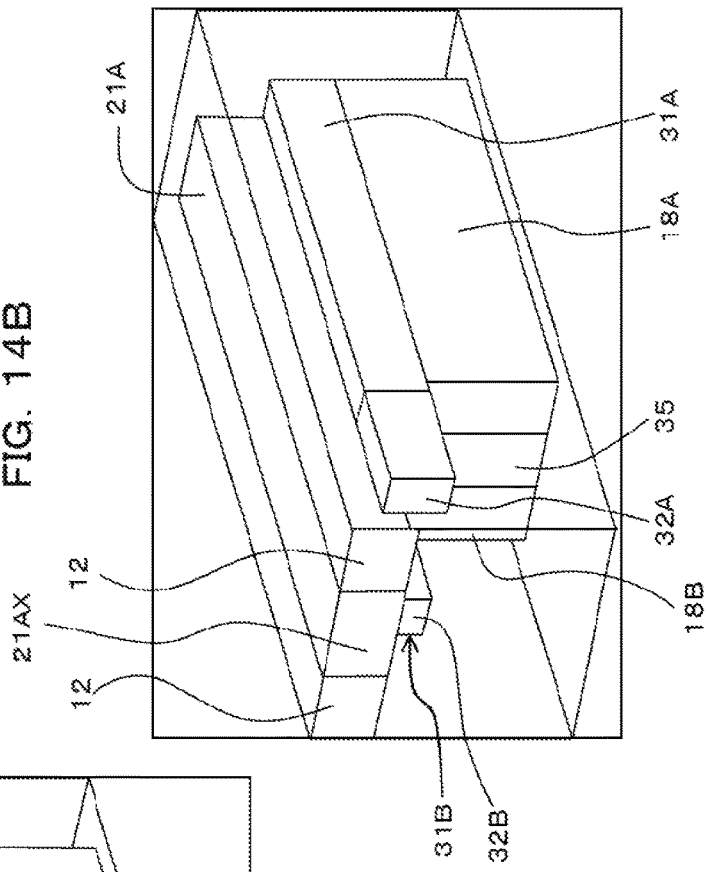
Figure 14A:
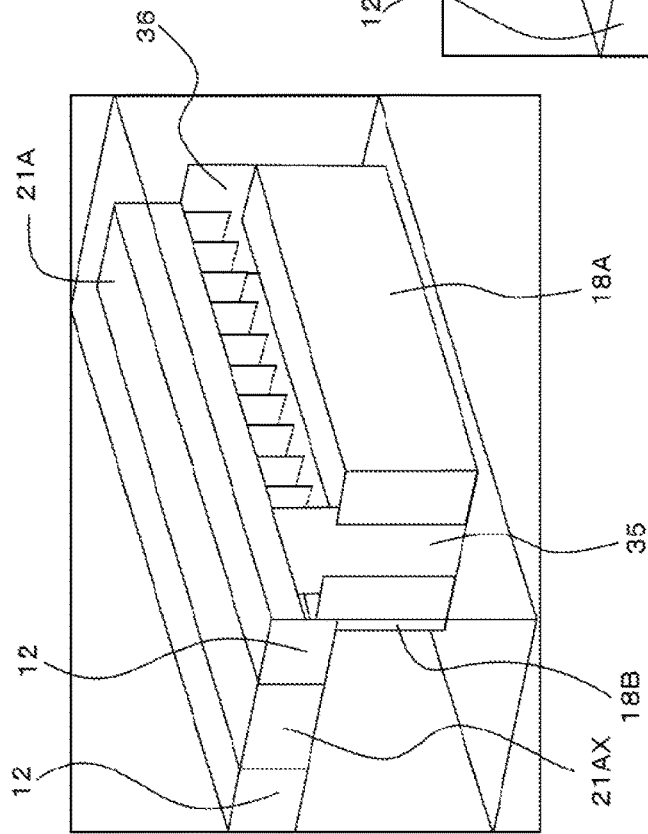
Figure 17:
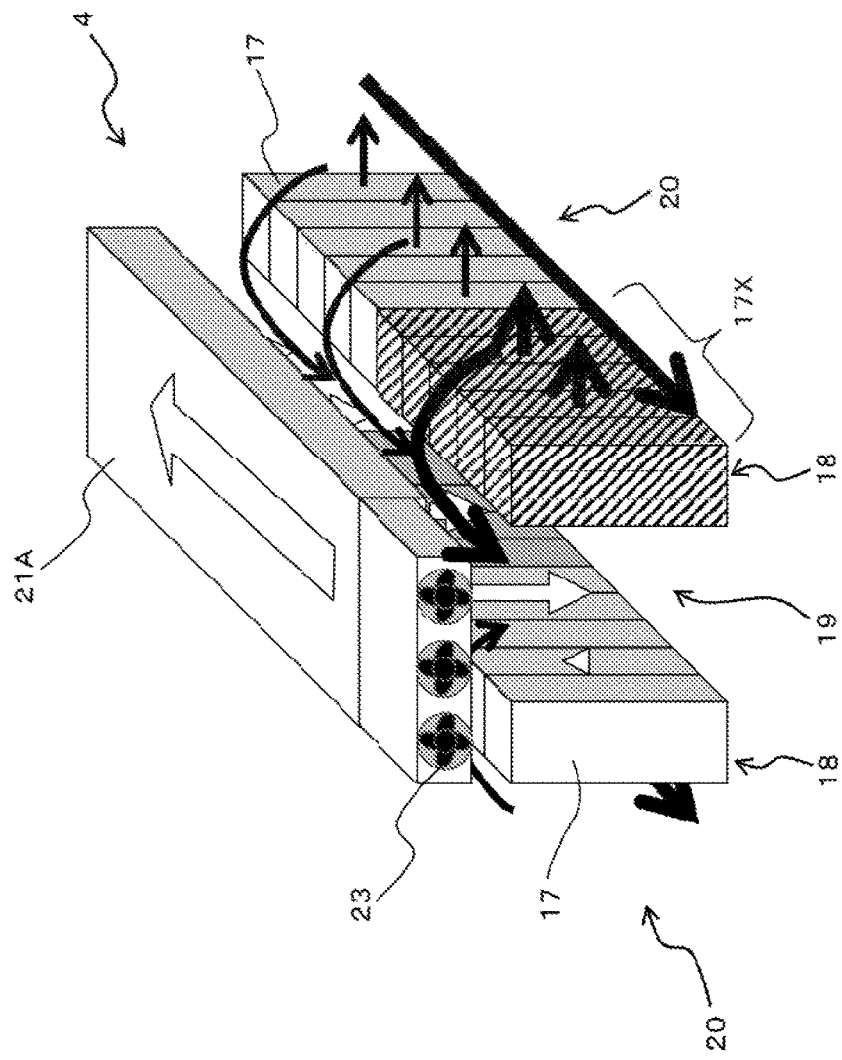
FIG. 17 is a schematic perspective view illustrating a subject of a conventional data center.

Here, FIG. 14B depicts a model of the present embodiment used for thermal-liquid analysis. Here, rack rows 18A and 18B in which ten racks are juxtaposed per one row (totaling 20 racks) are provided in the server room 4. Further, the cold air supply duct 21A (having ten air blowing ports) is provided over the cold aisle and the warm air circulation ducts 31A and 31B [individually including the restriction inclination plate 37 installed in such a manner as described above (refer to FIGS. 6A, 6B, 7A and 7B) and individually having ten air blowing ports] are provided at both sides of the cold air supply duct 21A, and the opposite ends of the two rack rows 18A and 18B are closed by side walls 35 and 36. Further, the warm air exhausting port 12 of the server room 4 is provided at the side of a cold air intake port 21AX of the cold air supply duct 21A, and the suction ports 32A and 32B of the warm air circulation ducts 31A and 31B are provided at the side of the warm air exhausting port 12. It is to be noted here that thermal-liquid analysis was performed also for a model of a comparative example [refer to FIG. 14A] in which the warm air circulation ducts 31A and 31B are not provided. While, in the model of the present embodiment, warm air is circulated to the cold aisle through the warm air circulation ducts 31A and 31B, in the model of the comparative example, warm air is circulated to the cold aisle passing over the rack rows 18A and 18B.

Further, the thermal-liquid analysis was performed in accordance with, as a calculation condition, two conditions including a first condition that some rack having a high heat generation amount exists in part of the rack rows 18A and 18B and the air amount to the rack having a high heat generation amount is great and a second condition that some rack having a high heat generation amount exists in part of the rack rows 18A and 18B and the exhaust air temperature of the rack having a high heat generation amount is high.

In the first condition from between the two conditions, the outside air temperature, outside air amount and target value of the rack intake air temperature were set to 10° C., 150 m³/min and 20° C., respectively, and the rack heat generation amount of (five) racks having a high heat generation amount was set to 6 kW and the rack heat generation amount of (fifteen) racks having a low heat generation amount was set to 2 kW. Further, the disposition of the racks having a high heat generation amount was set such that the racks were five racks at the nearer side of the rack row 18A at the right side as viewed from the side of the outside air intake port of the cold air supply duct (duct root side) and the air amount was set such that the temperature difference ΔT between the cold aisle and the hot aisles became 10° C. (totaling air amount of all racks is 300 m³/min). Consequently, the exhaust air temperatures of all racks became equal to one another and the air amount of the racks having a high heat generation amount became greater.

In contrast, in the second condition, the air amount of the server racks was set to such an air amount that, in the racks having a low heat generation amount, the temperature difference ΔT between the cold aisle and the hot aisles became 10° C. and, in the racks having a high heat generation amount, the temperature difference ΔT between the cold aisle and the hot aisles became 20° C. (totaling air amount of all racks was 250 m³/min). Consequently, the air amounts of all racks became equal to each other and the exhaust air temperature of the racks having a high heat generation amount became higher.

As a result, first in the first condition, in the case of the model of the comparative example, the temperature was increased locally and a great hotspot was generated by increase of the circulation amount in the proximity of the racks having a high heat generation amount and the highest temperature and the lowest temperature were 35.6° C. and 15.8° C., respectively, thereby causing a variability of 19.8° C. as depicted in FIGS. 15A and 15B. In contrast, in the case of the model of the present embodiment, since warm air having a uniform temperature was supplied to all racks, a hotspot reduced in size and the highest temperature and the lowest temperature are 23.5° C. and 14.7° C., respectively, thereby causing a variability of 8.8° C. as depicted in FIGS. 15C and 15D. Consequently, it was confirmed favorably that the variability was improved and uniformization of the temperature distribution was implemented favorably. It is to be noted that FIGS. 15A and 15C depict temperature distributions of the rack air intake temperature in the rack row 18B and FIGS. 15B and 15D depict temperature distributions of the rack air intake temperature in the rack row 18A. Further, a mark * is applied to the racks having a high heat generation amount.

Then, in the second condition, in the case of the model of the comparative example, the temperature of the circulation warm air in the proximity of the racks having a high heat generation amount became high and the temperature rose locally to generate a great hotspot as depicted in FIGS. 16A and 16B. Then, the highest temperature and the lowest temperature were 34.4° C. and 20.3° C., respectively, thereby causing a variability of 14.1° C. In contrast, in the model of the present embodiment, since warm air having a uniform temperature was supplied uniformly to all racks, a hotspot reduced in size and the highest temperature and the lowest temperature were 27.5° C. and 16.7° C., respectively, thereby causing a variability of 10.8° C. as depicted in FIGS. 16C and 16D. Thus, it was confirmed favorably that the variability was improved and uniformization of the temperature distribution was implemented favorably. It is to be noted that FIGS. 16A and 16C depict temperature distributions of the rack air intake temperature in the rack row 18B and FIGS. 16B and 16D depict temperature distributions of the rack air intake temperature in the rack row 18A. Further, a mark * is applied to the racks having a high heat generation amount.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A data center, comprising:
a first rack including a first electronic apparatus and further including a first air intake face that inhales air to be supplied to the first electronic apparatus and a first air exhaust face that exhausts air exhausted from the first electronic apparatus as first exhaust air;
a second rack including a second electronic apparatus and further including a second air intake face that inhales air to be supplied to the second electronic apparatus and a second air exhaust face that exhausts air exhausted from the second electronic apparatus as second exhaust air, the second air intake face being disposed in an opposing relationship to the first air intake face;
a supply duct provided over a first space between the first air intake face and the second air intake face, including an air intake fan and that supplies air inhaled by the air intake fan to the first space;
a first circulation duct including a first suction port that sucks the first exhaust air and a first exhaust port that is disposed at the first space side and that exhausts the first exhaust air, the first circulation duct being provided separately from the supply duct between an upper portion of the first rack and the supply duct so as to close up the first space and that circulates the first exhaust air to the first space;
a second circulation duct including a second suction port that sucks the second exhaust air and a second exhaust port that is disposed at the first space side and that exhausts the second exhaust air, the second circulation duct being provided separately from the supply duct between an upper portion of the second rack and the supply duct so as to close up the first space and that circulates the second exhaust air to the first space;
a first barrier that closes up the first space at one end portion of the first rack and the second rack; and
a second barrier that closes up the first space at the other end portion at the opposite side to the one end portion of the first rack and the second rack;

the first suction port and the second suction port are disposed at the first barrier side or the second barrier side, the first suction port and the second suction port are provided at a side of a room at which an exhaust port is provided, the first suction port directly sucks the first exhaust air from a second space at the opposite side to the first space across the first rack in the room, the first exhaust air is automatically circulated through the first circulation duct by a pressure difference between the first space and the second space, the second suction port directly sucks the second exhaust air form a third space at the opposite side to the first space across the second rack in the room, and the second exhaust air is automatically circulated through the second circulation duct by a pressure difference between the first space and the third space.

2. The data center according to claim 1, wherein the first circulation duct or the second circulation duct has a restriction structure that restricts a flow path in the inside thereof.

3. The data center according to claim 1, further comprising:
a first pressure sensor that detects a pressure of the first space; and
a fan controller that controls the air intake fan based on the pressure detected by the first pressure sensor.

4. The data center according to claim 3, further comprising:
a second pressure sensor that detects a pressure of the second space; and
a third pressure sensor that detects a pressure of the third space; wherein
the fan controller controls the air intake fan based on the pressures detected by the first pressure sensor, second pressure sensor and third pressure sensor.

5. The data center according to claim 4, wherein, when the pressure detected by the first pressure sensor is higher than the pressure detected by the second pressure sensor or when the pressure detected by the first pressure sensor is higher than the pressure detected by the third pressure sensor, the fan controller controls the air intake fan so as to decrease a number of rotations of the air intake fan.

6. The data center according to claim 3, further comprising:
a first temperature sensor that detects a temperature of the first space; wherein
the fan controller controls the air intake fan based on the temperature detected by the first temperature sensor.

7. The data center according to claim 6, further comprising:
a second temperature sensor that detects a temperature in the first circulation duct;

a third temperature sensor that detects a temperature in the second circulation duct; and
a fourth temperature sensor that detects a temperature of outside air; wherein
the fan controller controls the air intake fan based on the temperatures detected by the first temperature sensor, second temperature sensor, third temperature sensor and fourth temperature sensor.

8. The data center according to claim 7, wherein,
when it is decided based on the temperatures detected by the first temperature sensor, second temperature sensor and fourth temperature sensor that a circulation amount of the first exhaust air entering the first circulation duct is insufficient or when it is decided based on the temperatures detected by the first temperature sensor, third temperature sensor and fourth temperature sensor that a circulation amount of the second exhaust air entering the second circulation duct is insufficient, the fan controller controls the air intake fan so as to decrease a number of rotations of the air intake fan; and
when it is decided based on the temperatures detected by the first temperature sensor, second temperature sensor and fourth temperature sensor that a circulation amount of the first exhaust air entering the first circulation duct is excessive or when it is decided based on the temperatures detected by the first temperature sensor, third temperature sensor and fourth temperature sensor that a circulation amount of the second exhaust air entering the second circulation duct is excessive, the fan controller controls the air intake fan so as to increase a number of rotations of the air intake fan.

9. The data center according to claim 1, wherein the supply duct further includes a damper that guides air inhaled by the air intake fan to the first space.

10. The data center according to claim 9, further comprising:
a first power sensor provided on the first rack and that detects power supplied to the first electronic apparatus;
a second power sensor provided on the second rack and that detects power supplied to the second electronic apparatus; and
a damper controller that controls the damper based on the power detected by the first power sensor and the power detected by the second power sensor.

11. The data center according to claim 10, wherein, when the power detected by the first power sensor and the power detected by the second power sensor are zero, the damper controller performs control that closes the damper and the fan controller that controls the air intake fan performs control that stops the air intake fan.

* * * * *